(12) United States Patent
Koganei

(10) Patent No.: US 6,480,411 B1
(45) Date of Patent: Nov. 12, 2002

(54) MAGNETORESISTANCE EFFECT TYPE MEMORY, AND METHOD AND DEVICE FOR REPRODUCING INFORMATION FROM THE MEMORY

(75) Inventor: Akio Koganei, Ichikawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/695,075

(22) Filed: Oct. 25, 2000

(30) Foreign Application Priority Data

Oct. 25, 1999 (JP) ............................................. 11-302591
Sep. 18, 2000 (JP) ....................................... 2000-281863

(51) Int. Cl.[7] .............................................. G11C 11/00
(52) U.S. Cl. ...................... 365/158; 365/171; 365/173; 360/110; 360/113; 428/611
(58) Field of Search ................................ 365/158, 171, 365/173; 360/110, 113; 428/611

(56) References Cited

U.S. PATENT DOCUMENTS

| | | | |
|---|---|---|---|
| 5,459,687 A | 10/1995 | Sakakima et al. | 365/158 |
| 5,563,752 A * | 10/1996 | Komuro et al. | 360/113 |
| 5,835,003 A * | 11/1998 | Nickel et al. | 338/32 R |
| 5,872,690 A * | 2/1999 | Tadokoro et al. | 360/113 |
| 5,901,018 A * | 5/1999 | Fontana, Jr. et al. | 360/104 |
| 6,005,753 A * | 12/1999 | Fontana et al. | 360/113 |
| 6,023,395 A * | 2/2000 | Dill et al. | 360/113 |
| 6,040,961 A * | 3/2000 | Gill | 360/113 |
| 6,052,263 A * | 4/2000 | Gill | 360/113 |
| 6,083,632 A * | 7/2000 | Fujikata et al. | 428/611 |
| 6,178,073 B1 * | 1/2001 | Hayashi | 360/324.11 |
| 6,256,222 B1 * | 7/2001 | Sakakima et al. | 365/158 |
| 6,261,646 B1 * | 7/2001 | Chen et al. | 427/531 |

FOREIGN PATENT DOCUMENTS

| | | |
|---|---|---|
| JP | 6-243673 | 9/1994 |
| JP | 410302456 A * | 11/1998 |
| JP | 410302457 A * | 11/1998 |
| JP | 20000040355 A * | 2/2000 |

* cited by examiner

Primary Examiner—Viet Q. Nguyen
(74) Attorney, Agent, or Firm—Fitzpatrick, Cella, Harper & Scinto

(57) ABSTRACT

A magnetoresistance effect type memory in and from which information is recorded and reproduced by utilizing a magnetoresistance effect comprises a substrate, a magnetoresistance film provided on the substrate, which comprises a reproducing layer, a memory layer and a non-magnetic layer provided between the reproducing layer and the memory layer, and a magnetization-fixing layer provided on the substrate, which orients a magnetization of the reproducing layer to one direction. In the magnetoresistance effect type memory a conductor wire may be disposed on the magnetoresistance film on a side opposite to the substrate.

A recording-reproducing method for the magnetoresistance effect type memory comprises the steps of applying any one of positive and negative electric current pulses to the conductor wire, and detecting a change in resistance of the magnetoresistance film to reproduce information recorded in the memory layer. A recording-reproducing device for recoding and reproducing information in and from the magnetoresistance effect type memory comprises a means for supplying a uni-directional electric current to said conductor wire, and a means for detecting a change in resistance of said magnetoresistance film to reproduce information recorded in the memory.

21 Claims, 10 Drawing Sheets

"0"

"1"

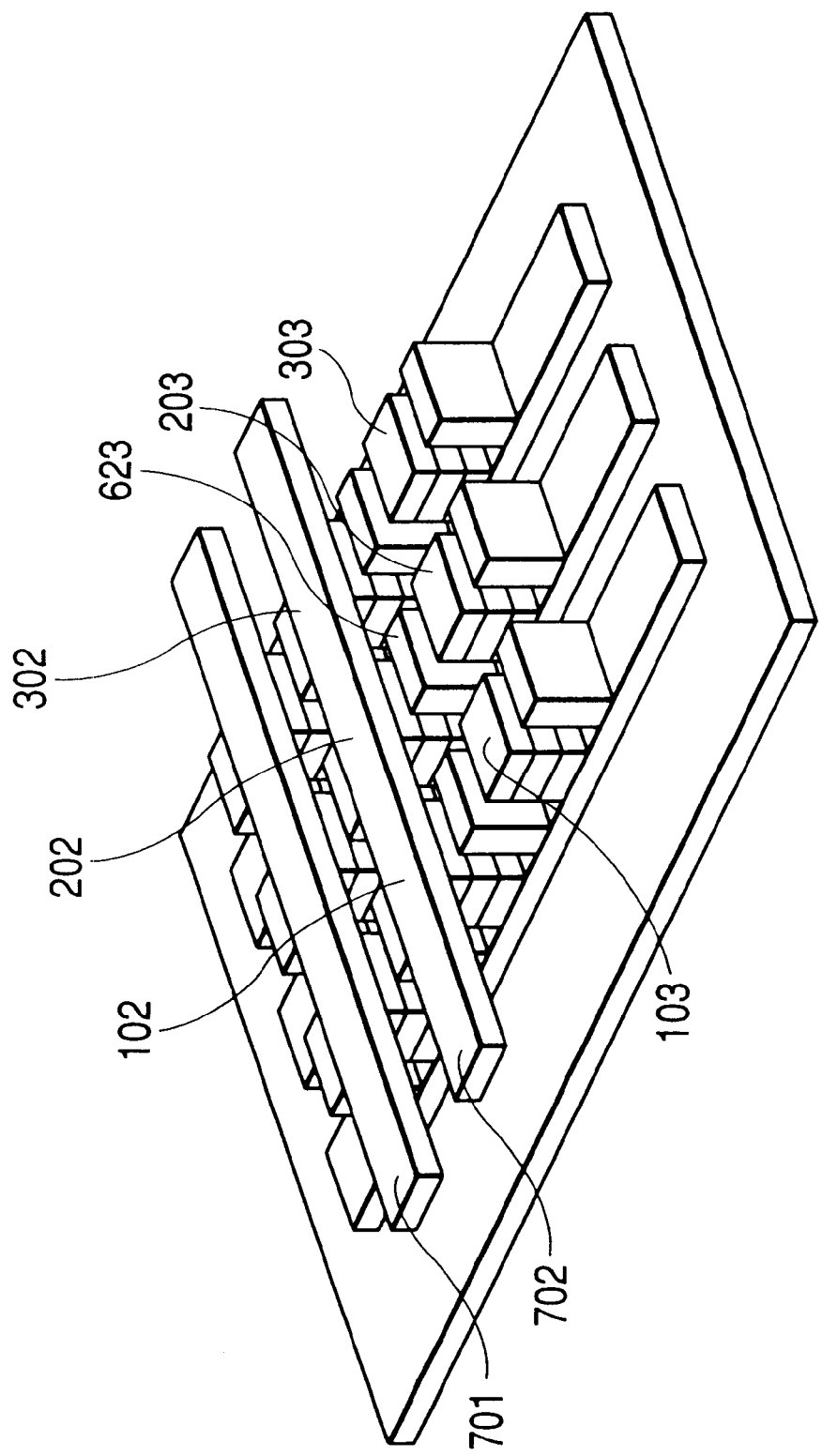

MAGNETORESISTANCE EFFECT TYPE MEMORY, AND METHOD AND DEVICE FOR REPRODUCING INFORMATION FROM THE MEMORY

BACKGROUND OF THE INVENTION

1. Field of the Invention

This invention relates to a memory that utilizes magnetoresistance effect. More particularly, it relates to a magnetoresistance effect type memory requiring only a small power consumption at the time of reproduction, improved in memory characteristics and utilizable as an inexpensive memory adapted to computer peripheral equipment, the memory being preferable as peripheral circuits are made high-speed, and a reproduction method and a reproducing device which make use of such a memory.

2. Related Background Art

Memories used in computers or electronic instruments are under strong competition in their technical development. Techniques progress at a rapidly advancing rate, and various new memory devices are proposed. In recent years, giant magnetoresistance (GMR) effect has been discovered in magnetoresistive films holding a non-magnetic layer between ferromagnetic layers, and magnetic sensors and memories that utilize this phenomenon are attracting notice. In the following description, memories that utilize magnetoresistive films are generically called MRAM.

In the MRAM, a triple-layer structure having two ferromagnetic layers and a thin non-magnetic layer held between them forms a basic structural unit where information is recorded. Between the two ferromagnetic layers holding a non-magnetic layer between them, the state of "0" or "1" is recorded by utilizing a phenomenon that resistance values differ between a case where their directions of magnetization are identical and a case where they are antiparallel.

When recorded information is read, an alternating magnetic field weaker than that at the time of writing is applied to cause only one ferromagnetic layer to change in its direction of magnetization, where changes in resistance values are measured to read the state of "0" or "1". The MRAM has an advantage that it has a good resistance to radiations, is non-volatile in principle, is high-speed and is not limited in the number of times for writing, because the information is magnetically recorded. Appropriation of existing semiconductor techniques can afford to perform high-density recording with ease, and hence there is an expectation of its substitution for DRAM in future. For example, Japanese Patent Application Laid-open No. Hei6-243673 discloses a proposal relating to its utilization as a memory.

The operating principle of the MRAM is shown below. FIG. 5A illustrates the construction of an MRAM. The MRAM is so constructed as to have on a substrate a first magnetic layer 11, a non-magnetic layer 12, a second magnetic layer 13, an insulating layer 80 and a write wire (word wire) 51 in this order. The magnetoresistive film portion formed of combination of ferromagnetic layers with a non-magnetic layer may have a multi-layer structure.

Two ferromagnetic layers, the first magnetic layer 11 and second magnetic layer 13, are formed of combination of a soft magnetic material and a hard magnetic material. The soft magnetic material forms a reproducing layer from which information is read, and the hard magnetic material forms a memory layer in which information is stored. In the MRAM shown in FIG. 5A, the first magnetic layer 11 serves as a reproducing layer making use of the soft magnetic material, and the second magnetic layer 13 as a memory layer making use of the hard magnetic material. A buffer layer of SiN, Ta or the like may also be provided between the substrate and the first magnetic layer 11.

Recording operation of the MRAM is performed by changing the direction of magnetization of the memory layer second magnetic layer 13 by means of a magnetic field generated in the write wire.

FIG. 5B shows a case where "0" is written. A recording electric current is flowed through the write wire from the back to the front in the vertical direction as viewed on the drawing, whereupon a magnetic field is generated in the direction of arrows. When information is recorded, the magnetic field generated is made strong, so that the directions of magnetization not only of the reproducing layer first magnetic layer 11 but also of the memory layer second magnetic layer 13 are written in the rightward direction as viewed on the drawing. This state is "0".

FIG. 5C shows a case where "1" is written. A recording electric current is flowed through the write wire from the front to the back in the vertical direction as viewed on the drawing, whereupon a magnetic field is generated in the direction of arrows. When recorded, the magnetic field generated is made strong, so that the directions of magnetization not only of the reproducing layer first magnetic layer 11 but also of the memory layer second magnetic layer 13 are written in the leftward direction as viewed on the drawing. This state is "1".

On the other hand, when information is reproduced, reproducing electric current pulses weaker than those at the time of recording are flowed through the write wire sequentially in the both directions to reverse the magnetization of the reproducing layer, and a change in resistance at that moment is read, thus the reproduction is accomplished.

FIGS. 5D to 5G are a series of views showing the reproducing operation. In the state the "0" is kept recorded as shown in FIG. 5B, the directions of magnetization of the magnetic layers change as shown in FIG. 5D when first a reproducing electric current is flowed through the write wire from the front to the back in the vertical direction as viewed on the drawing, and change as shown in FIG. 5E when next the electric current is flowed in the opposite direction.

When first the reproducing electric current is flowed through the write wire as shown in FIG. 5D, from the front to the back in the vertical direction as viewed on the drawing, a weak magnetic field is generated in the direction of an arrow. At such a magnetic field strength, the reproducing layer first magnetic layer 11 reverses in magnetization, but the magnetization of the memory layer second magnetic layer 13 remains kept in the direction of "0". When next the reproducing electric current is flowed through the write wire as shown in FIG. 5E, from the back to the front in the vertical direction as viewed on the drawing, a weak magnetic field is generated in the direction of an arrow. At such a magnetic field strength, the reproducing layer first magnetic layer 11 reverses in magnetization, but the magnetization of the memory layer second magnetic layer 13 remains kept in the direction of "0".

Take note of the directions of magnetization of the two magnetic layers. When first the reproducing electric current is flowed through the write wire from the front to the back in the vertical direction as viewed on the drawing, the directions of magnetization of the first magnetic layer 11 and second magnetic layer 13 stand antiparallel. When next the reproducing electric current is flowed through the write wire from the back to the front in the vertical direction as viewed on the drawing, the directions of magnetization of the first magnetic layer 11 and second magnetic layer 13 stand parallel. Hence, in the course where electric current pulses are flowed in the two directions, the resistance of the write wire changes from a high resistance in an antiparallel state to a low resistance in a parallel state. The state where resistance values change from a high resistance to a low resistance in this way is read to be "0".

On the other hand, in the state the "1" is kept recorded as shown in FIG. 5C, the directions of magnetization of the magnetic layers change as shown in FIG. 5F when first a reproducing electric current is flowed through the write wire from the front to the back in the vertical direction as viewed on the drawing, and change as shown in FIG. 5G when next the electric current is flowed in the opposite direction.

When first the reproducing electric current is flowed through the write wire as shown in FIG. 5F, from the front to the back in the vertical direction as viewed on the drawing, a weak magnetic field is generated in the direction of an arrow. At such a magnetic field strength, the reproducing layer first magnetic layer 11 does not reverse in magnetization, and also the magnetization of the memory layer second magnetic layer 13 remains kept in the direction of "1". When next the reproducing electric current is flowed through the write wire as shown in FIG. 5G, from the back to the front in the vertical direction as viewed on the drawing, a weak magnetic field is generated in the direction of an arrow. At such a magnetic field strength, the reproducing layer first magnetic layer 11 reverses in magnetization, but its strength is insufficient for changing the magnetization of the memory layer second magnetic layer 13, which remains kept in the direction of "1".

Take note of the directions of magnetization of the two magnetic layers. When first the reproducing electric current is flowed through the write wire from the front to the back in the vertical direction as viewed on the drawing, the directions of magnetization of the first magnetic layer 11 and second magnetic layer 13 stand parallel. When next the reproducing electric current is flowed through the write wire from the back to the front in the vertical direction as viewed on the drawing, the directions of magnetization of the first magnetic layer 11 and second magnetic layer 13 stand antiparallel. Hence, in the course where electric current pulses are flowed in the two directions, the resistance of the write wire changes from a low resistance in a parallel state to a high resistance in an antiparallel state. The state where resistance values change from a low resistance to a high resistance in this way is read to be "1".

Thus, whether the information recorded is "0" or "1" can be recognized by reading the changes in resistance that are caused when weak electric current pulses are flowed through the write wire. This recording reproduction method enables high-speed drive in non-volatile and non-destructive manner, and hence ideal memory characteristics can be expected. Methods of detecting changes in magnetoresistance electrically at the time of the above reproduction are proposed in variety, and are roughly grouped into absolute detection, in which their extent is compared by the value of resistance itself, and differential detection, in which judgement is made on whether the changes in resistance that are caused when electric currents are shifted in two directions are in the direction of increase or in the direction of decrease.

In the foregoing description of operation, a method in which memory is recorded and reproduced using the write wire. The write wire, however, is not essential as a constituent of the MRAM. In some structure, any adjacent other wiring may be appropriated to generate the magnetic field with which the magnetization of ferromagnetic layers is reversed.

From the viewpoint of materials used and mechanism of magnetoresistance, construction of the MRAM can be classified into a spin dependent scattering type making use of a metal non-magnetic layer as an intermediate layer, a spin valve type where the direction of magnetization of one ferromagnetic layer is fixed with an antiferromagnetic layer, a spin dependent tunneling type making use of an insulator non-magnetic layer, and besides a granular type where fine particles of a magnetic material are dispersed in the non-magnetic layer, and a CMR (colossal magnetoresistance) type making use of a perovskite oxide film.

In the spin dependent scattering type, the non-magnetic layer is formed as a Cu or the like metal layer and GMR takes place on account of spin dependent scattering between two magnetic layers. More specifically, when the direction of magnetization of the magnetic layers are parallel, electrons having a spin in the direction opposite to magnetization are scattered but electrons having a spin in the same direction as magnetization are not scattered, resulting in a low resistance on the whole. When conversely the direction of magnetization of the magnetic layers are antiparallel, both the electrons having a spin in the same direction as magnetization and the electrons having a spin in the direction opposite to magnetization are scattered, resulting in a high resistance on the whole. In that case, an MR (magnetoresistance) ratio of about 5% to about 10% is obtainable at room temperature, which is greater than the magnetoresistance effect which depends on the direction of electric current and magnetization, but is smaller than that of a spin dependent tunneling type.

The spin valve type is the same as the spin dependent scattering type in principle, but differs therefrom in that an antiferromagnetic layer is combined as one ferromagnetic layer to pin up the direction of magnetization. The direction of magnetization of the other magnetic layer can freely be rotated. Plotting a magnetization curve, it has a shape asymmetric depending on the direction of magnetization, which linearly changes from a low resistance to a high resistance in the vicinity of the zero magnetic field, providing a structure suited for magnetic sensors which detect a very weak magnetism. At present, this type has been put into practical use as read sensors of hard disks.

In the spin dependent tunneling type, the non-magnetic layer is formed of an insulator, where electrons pass through the insulator by tunneling to move across the two magnetic layers, and the magnetoresistance effect takes place in the form that depends on a difference in state and density of spinning electrons. More specifically, when the directions of magnetization of the magnetic layers are parallel, electrons having an up spin can come by tunneling into the state of up spin where the other ferromagnetic layer is vacant, and electrons having a down spin into the state of down spin where the other ferromagnetic layer is vacant. Hence, the difference in state and density of spinning electrons becomes small to provide a low resistance. When conversely the directions of magnetization of the magnetic layers are antiparallel, both the electrons having an up spin and the electrons having a down spin can not move by tunneling, and hence the difference in state and density of spinning electrons becomes large to provide a high resistance. In that case, an MR ratio of about 10% to about 30% is obtainable at room temperature, which is greater than that of the spin dependent scattering type. However, because of the structure interposing the insulator, the device resistance itself is greater than that of the spin dependent scattering type. Utilizing this phenomenon of spin dependent tunneling, magnetoresistance films formed in the spin valve type using the antiferromagnetic film are energetically studied as those for future hard-disk read sensors.

In the granular type, there are two types, a spin dependent scattering type making use of a metal as the non-magnetic layer and a spin dependent tunneling type making use of an insulator. In the spin dependent scattering type and spin dependent tunneling type described previously, a role is clearly allotted for each layer, whereas, in the granule type, what greatly differs is that the GMR takes place in the form that depends on spins of individual fine magnetic particles dispersed in a matrix. In a spin dependent tunneling type of a Co/AlOx system, an MR ratio of about 8% is obtainable at room temperature.

In the CMR type, there are a type in which a Mn oxide having a perovskite structure is held between perovskite Mn oxides having a higher spin polarization rate, and a type in which a laminar structure in perovskite is utilized as a tunnel junction. The CMR type has so high a spin polarization rate that an MR ratio of as high as 400% is obtainable at a very low temperature.

Magnetic materials used in the MRAM can be classified by direction of magnetization, into an in-plane magnetization film type having a magnetizing component that is parallel to the film plane and a perpendicular magnetization film type having a magnetizing component that is perpendicular to the film plane. Ferromagnetic materials such as NiFe and Co are those of the in-plane magnetization film type the direction of magnetization of which is parallel to the film plane. Such in-plane magnetization films, however, have a problem of the phenomenon of curling of magnetization because magnetic poles may approach to each other as magnetic materials becomes finer, resulting in a great antimagnetization. Once the curing occurs, it becomes difficult to distinguish the direction of magnetization. Accordingly, in the MRAM making use of an in-plane magnetization film, in order to provide shape anisotropy, the ferromagnetic layers serving as a memory cell must be made to have the shape having a major axis (e.g., a rectangular shape) when viewed on plane. It is estimated that the ratio of major axis/minor axis of such a rectangle must be at least twice. Hence, in order to prevent the phenomenon of curing, the memory cell is limited in size to provide an inhibitory factor for making the degree of integration higher.

Meanwhile, when ferrimagnetic materials comprised of rare earth-transition metals such as TbFe, TbFeCo and GdFe are used as materials of ferromagnetic layers, these magnetic materials have a high perpendicular magnetization anisotropy. Hence, depending on layer thickness and composition, they provide perpendicular magnetization films having magnetization in the direction perpendicular to the film plane. In the case of perpendicular magnetization films, the direction of magnetization is the film-plane vertical direction that forms the greatest antimagnetic field in shape, thus they have already overcome the maximum coefficient of antimagnetic field at the time they exhibit the perpendicular magnetization anisotropy. Namely, it is unnecessary to make memory cells rectangular as in the case of in-plane magnetization films, and the memory cells can be made to have the shape of a square plane. In addition, making a device minute makes its planar area smaller, compared with layer thickness direction which is the readily magnetizable axis. Hence, from the viewpoint of shape anisotropy, this tends to make the curling of magnetization less occur. Thus, the perpendicular magnetization films are more advantageous than the in-plane magnetization films in order to make higher the degree of integration of memory cell areas.

The direction of electric current is roughly grouped into CIP (current in plane), which is parallel to film plane, and CPP (current perpendicular to plane), which is perpendicular to film plane, in accordance with the manner of flowing of electric current to the MRAM or the manner of disposing electrodes. FIGS. 6A and 6B show respectively corresponding electrode structures.

As shown in FIG. 6A, the CIP is a structure wherein sense layers are provided on both sides of a memory cell consisting of first magnetic layer 81/non-magnetic layer 82/second magnetic layer 83. Sense electric current flows in parallel to the film plane. In FIG. 6A, one of the sense layers 84 is illustrated by dotted lines. In the CIP, the spin dependent scattering type magnetoresistance film is used. In such a case, one cell has a resistance of about 10 $\Omega$ as sheet resistance, and a sense wire has a sheet resistance of 0.05 $\Omega$. Also, the rate of magnetoresistance change is about 5% to about 10%, which is smaller than that of the spin dependent tunneling type. When in CIP structure a large number of cells are connected in series to sense wires and signals are detected at the both ends thereof, changes in resistance for one cell are used as signals, with respect to the resistance synthesized by adding up resistance values of many cells connected, and hence it is not easy to achieve a high SN.

As shown in FIG. 6B, the CPP is a structure wherein sense layers are provided on the top and bottom of a memory cell consisting of first magnetic layer 91/non-magnetic layer 92/second magnetic layer 93. Sense electric current flows in the direction perpendicular to the film plane. In FIG. 6B, the upper sense layer 94 is illustrated by dotted lines. The lower sense layer 95 is illustrated by continuous lines. In the CPP, the spin dependent tunneling type magnetoresistance film may preferably be used. In such a case, one cell has a resistance ranging form several k$\Omega$ to tens of k$\Omega$, having a larger value of resistance than sense wires. Also, the rate of magnetoresistance change is about 10% to about 30%, which is larger than that of the spin dependent scattering type. More specifically, sufficiently great changes in resistance can be obtained even when the magnetoresistance films are connected to sense wires, so that a high SN can be achieved.

In this CPP structure, the cell is disposed at an intersection of sense wires. Hence, when many cells are disposed, the cells are each connected in parallel. In such construction, when resistance of a certain cell is to be detected, electric current is flowed through a sense wire intersecting that cell, whereby the resistance can be detected without being affected by other cells so much. Hence, a higher SN can be achieved than in the CIP structure. Thus, the cells that can be connected to one row of sense wires can be in a larger number and a large-scale matrix can be formed with greater ease in the CPP structure than in the CPP structure. Namely, considering that a large number of memory cells are arranged as memory devices to drive them, the CPP structure is more advantageous than the CIP structure.

Where differential detection is utilized in the MRAM, changes in resistance at the time positive and negative electric currents are alternately flowed are differentially detected to recognize "0" or "1". A bipolar power source is necessary for generating the positive and negative electric currents. In order to materialize a high-speed bipolar function, it is important to operate several switches at a high speed and accurate timing in order to reverse the direction of electric current. Any deviation of timing causes ringing or overshoot in electric current waveforms. These may cause misoperation, and must be prevented as far as possible. To prevent ringing or overshoot, it is indispensable to optimize power source circuits taking account of wiring capacity, load resistance and so force which can be delay factors. This require a large space to be occupied by such power source circuits concurrently with connection of more transistors for materializing the function of switching, bringing about a problem in making higher the degree of integration as memories. This causes a difficulty in making the degree of integration higher, and hence may also be a factor which makes a memory require a high unit cost per bit.

Recently, as a field where solid-state memories are utilized, MP3 players attract notice in place of Walkman type headphone stereophonic players utilizing tape mediums. When applied to MP3 players, the solid-state memories can fully show their advantages from the viewpoint of resistance to shocks, durability, making compact and so forth. In addition, they require no mechanical drives and can make the most of an advantage of low power consumption. Also, it is supposed that reproduction-only sources making use of solid-state memories can be supplied in place of reproduction-only sources supplied for CDs and MDs.

The MRAM, too, is considered to have a reasonable number of chances where it is utilized for the needs on reproduction-only. To achieve its wide spread, the space and cost for the bipolar power sources exclusively used for reproduction as stated above can not be disregarded.

The above problems are solved if the signal reproduction of the MRAM can be materialized by flowing any one of positive and negative electric current pulses. If any bipolar function becomes unnecessary in a power source circuit to be added to conductor wires, when information is reproduced, the circuit construction can be simplified and also a cost reduction can be achieved. Also, any limitations on making the degree of integration higher can be eliminated, so that it becomes possible to further lower the unit cost per bit with ease. Although there is such a demand, any signal reproduction using any one of positive and negative electric currents has not been materialized.

SUMMARY OF THE INVENTION

The present invention solves the problems discussed above. Accordingly, an object of the present invention is to provide an MRAM which enables reproduction without applying positive and negative electric current pulses, and provide a method of reproducing information from such an MRAM by applying only a positive or negative electric current pulse, and a reproducing device used in such a method.

Another object of the present invention is to materialize an inexpensive memory having a high MRAM characteristics and adapted to computer peripheral equipment, the memory being preferable as peripheral circuits are made high-speed.

The above objects can be achieved by a magnetoresistance effect type memory in and from which information is recorded and reproduced by utilizing a magnetoresistance effect, the memory comprising;

a substrate;

a magnetoresistance film provided on the substrate, which comprises a reproducing layer, a memory layer and a non-magnetic layer provided between the reproducing layer and the memory layer; and a magnetization-fixing layer provided on the substrate, which orients a magnetization of the reproducing layer to one direction.

The above objects can also be achieved by a recording-reproducing method for the above magnetoresistance effect type memory having a conductor wire in its vicinity, the method comprising the steps of;

applying any one of positive and negative electric current pulses to the conductor wire; and detecting a change in resistance of the magnetoresistance film to reproduce information recorded in the memory layer.

The above objects can still also be achieved by a recording-reproducing device for recoding and reproducing information in and from the above magnetoresistance effect type memory having a conductor wire in its vicinity, the device comprising;

a means for supplying a uni-directional electric current to the conductor wire; and a means for detecting a change in resistance of the magnetoresistance film to reproduce information recorded in the memory.

These will be described in detail in Description of The Preferred Embodiments given later.

BRIEF DESCRIPTION OF THE DRAWINGS

FIG. 5A illustrates an example of the construction of an MRAM (spin dependent scattering type); FIGS. 5B and 5C, signal recording; and FIGS. 5D, 5E, 5F and 5G, the operating principle of signal reproduction.

FIGS. 7A and 7B show the step of forming a patterned magnetoresistance film;

FIGS. 7C and 7D, the step of forming an insulating film; and FIGS. 7E and 7F, the step of forming a conductor wire and a metal film for a probe pad.

FIG. 8A shows waveforms in the state of "0"; and FIG. 8B, in the state of "1".

FIG. 9A shows the state of "0"; and FIG. 9B, the state of "1".

FIG. 10 is a perspective view diagrammatically showing the construction of MRAMs formed in an array in Example 4 of the present invention.

DESCRIPTION OF THE PREFERRED EMBODIMENTS

The present invention will be described below in detail with reference to the accompanying drawings.

In the MRAM of the present invention, in place of a means conventionally used to pulsewise positive/negative switch the direction of application of electric currents flowed through word wires at the time of reproduction of recorded information, a magnetization-fixing layer is used to effect the reversal of magnetization of a reproducing layer.

With regard to the MRAM of the present invention, its construction and a method of reproducing recorded information therefrom are described below with reference to the drawings.

First, the magnetization-fixing layer is a magnetic layer disposed in the vicinity of a magnetoresistance film and having previously been oriented to be magnetized in one direction, by applying a magnetic field. It can retain this state of magnetization by the aid of a desired coercive force even after the external magnetic field has been removed. Materials and layer thickness of the magnetization-fixing layer may appropriately selected in accordance with properties required for the magnetoresistance film, and are not limited to those in the following embodiments as long as the layer can function as stated above.

The magnetization-fixing layer is disposed in the spatial vicinity with respect of a pair of magnetoresistance films that form a cell. It has the function to apply a magnetic field in the direction of readily magnetizable axes of magnetic layers constituting the magnetoresistance film, to retain an initial magnetized state previously set by applying a magnetic field from the outside, and to orient in one direction the direction of magnetization of the first magnetic layer serving as a reproducing layer, when a magnetic field that signal-reproducing electric-current generates is approximately zero. Hence, whether the relationship of magnetization direction between the first magnetic layer and the second magnetic layer is parallel or antiparallel can be recognized at the time the magnetic field that signal-reproducing electric-current generates is approximately zero. Namely, signals can be detected by applying any one of positive and negative electric currents. Whichever direction the electric current is passed through one conductor wire in can be discretionally defined as positive (plus) or negative (minus) direction.

This magnetization-fixing layer can be prepared by various methods. When memory cells are prepared, a part of the magnetoresistance film formed may be appropriated as the magnetization-fixing layer. Also, a different magnetic material may be formed into a film in addition to the magnetoresistance film of a memory cell to provide the magnetization-fixing layer at a position adjoining to the memory cell.

How the present invention operates will be described taking the case of an instance where a spin dependent scattering film of the in-plane magnetization film type is used in the magnetization-fixing layer.

Figure 1:
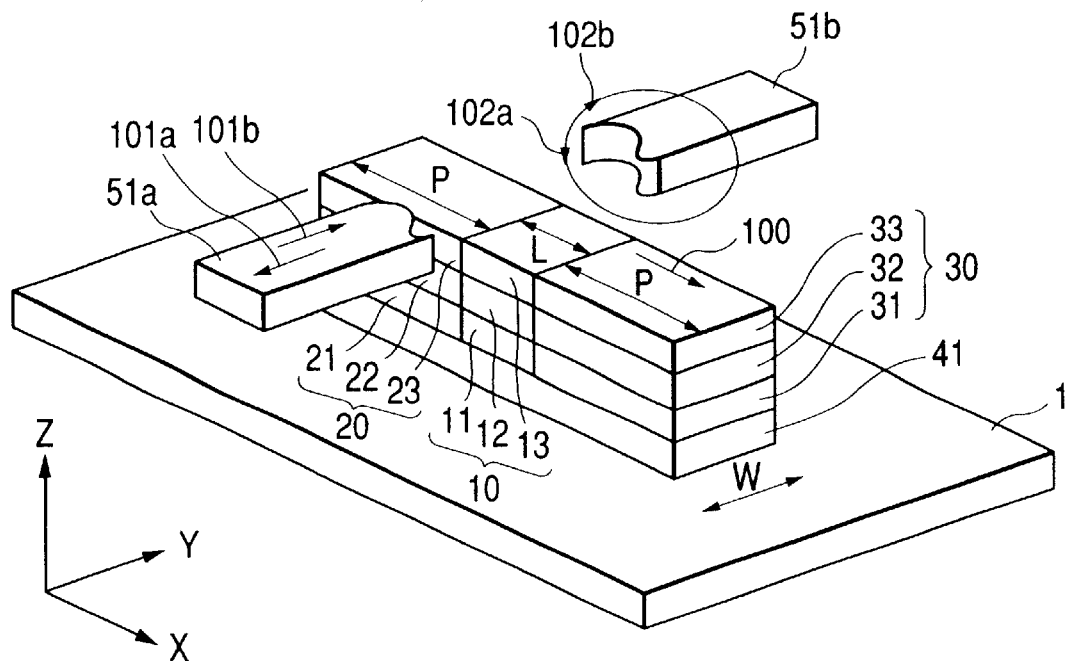
FIG. 1 is a perspective view diagrammatically showing an example of the construction of an MRAM (spin dependent scattering type) of the present invention, provided with a magnetization-fixing layer having the same layer constitution as the magnetoresistance film.

FIG. 1 shows an example of the construction of a memory cell. Reference numeral 1 denotes a substrate; 11, 21 and 31, first ferromagnetic layers; 12, 22 and 32, non-magnetic layers; and 13, 23 and 33, second ferromagnetic layers. The layers 11, 12 and 13 are combined to form a magnetoresistance film 10; the layers 21, 22 and 23, a magnetization-fixing layer 20; and the layers 31, 32 and 33, a magnetization-fixing layer 30. Reference numeral 41 denotes a buffer layer; and 51, a conductor wire. The conductor wire 51 lies right above the magnetoresistance film 10 via an insulating layer (not shown). In FIG. 1, it is illustrated dividedly into 51a and 51b so as to be easy to see.

At the time of recording and reproducing information, a sense electric current is flowed through the magnetization-fixing layer 20, the magnetoresistance film 10 and the magnetization-fixing layer 30 in this order and a word electric current is flowed through the conductor wire 51 in the directions of arrows 10a and 101b. The first ferromagnetic layer 21 of the magnetization-fixing layer 20 and the first ferromagnetic layer 31 of the magnetization-fixing layer 30 are both kept magnetized in the in-plane given direction. In accordance with that direction of magnetization, a magnetic coupling force is kept to act on the first ferromagnetic layer 11 of the magnetoresistance film 10. Information is recorded or reproduced by changing the direction of magnetization of the first ferromagnetic layer 11 of the magnetoresistance film 10 by means of a synthesized magnetic field generated by the sense electric current and word electric current.

The length of the magnetoresistance film 10 using the in-plane magnetization film, in its memory cell sense wire direction is represented by L, the width by W and the length of each magnetization-fixing layer by P. The length P corresponds to the distance to the next memory cell when many memory cells are arranged.

Here, the size may be so selected as to be within the range of P/L>2.5, where signals can be reproduced by applying only a positive or negative electric current pulse which generates a magnetic field opposite to the direction of initialization magnetization that has previously been set by applying an external magnetic field even if the word electric current is not flowed toward both directions. More specifically, the first ferromagnetic layer 11 of the magnetoresistance film 10 is surrounded by the magnetization-fixing layers 20 and 30 directed to the direction of initialization magnetization, and hence has a strong tendency of following the same direction of the direction of magnetization of the both. For example, when the above direction of initialization magnetization is antiparallel to the ferromagnetic layer (memory layer) in which the signal of "1" has been written, the word electric current becomes zero, and becomes stable in the antiparallel state when the electric current magnetic field applied to the first ferromagnetic layer (reproducing layer) of the magnetoresistance film 10 becomes substantially zero.

Hence, the presence or absence of electric current pulses which generate a magnetic field opposite to the direction of initialization magnetization causes a change from a high resistance to a low resistance in the case of "0", and from a low resistance to a high resistance in the case of "1". This change may be differentially detected, thus the "1" and "0" can be recognized.

In the case when the spin dependent scattering film of the in-plane magnetization film type is used as the magnetization-fixing layer as shown in FIG. 1, the value of P/L must be larger than 2.5, but, if it is too large, problems may occur such that a great electric current may be required when signals are recorded and signals are reproduced in a small margin. Also, a smaller value is desirable from the viewpoint of the degree of integration. Accordingly, the value of P/L may preferably be set not larger than 50, and may more preferably be selected within the range of from 2.5 to 10.

In the reproducing method making use of only the pulse electric current of any one of positive and negative, the lengths L and P are closely concerned with the amount of electric current required for the reproduction, but the width W is not greatly concerned. However, the direction of magnetization may become limited to a component parallel to the length L with a decrease in the width W. Hence, there is a tendency of an increase in energy for the reversal of magnetization at the time of reproduction and an increase in word electric current necessary for the reproduction of signals.

The principle of reproduction in the present invention will be further detailed below with reference to FIG. 1.

The direction of initialization magnetization that has previously been set by applying an external magnetic field to the whole memory array is regarded as −X direction. Therefore, the directions of magnetization of the magnetoresistance film 10 and magnetization-fixing layers 20 and 30 in a case where no electric current is flowed at all are −X directions. In practice, the direction of magnetization is determined on X-Y plane by means of the synthesized magnetic field generated by the sense electric current and word electric current. To simplify description, the effect of the magnetic field the sense electric current generates is not taken into account, where the direction of magnetization of the memory cell is determined in +X or −X direction, depending on the directions 102a and 102b of a magnetic field the word electric current flowing through the conductor wire 51 has generated and on the size of the magnetic field.

First, think about the case where positive and negative electric currents are flowed as in the conventional reproducing method. The word electric current is flowed in the direction of an arrow 101a, whereupon the magnetic field generated comes to be in the direction of an arrow 102a. When a magnetic field stronger than the coercive force of the first ferromagnetic layer 11 is generated, the magnetization of the first ferromagnetic layer 11 comes in the direction of the arrow 102a. Since the first ferromagnetic layer 11 is positioned beneath the conductor wire 51, its direction of magnetization is +X direction. Next, the word electric current is flowed in the direction of an arrow 101b, whereupon the magnetic field is reversed in the direction of the arrow 102b, so that the direction of magnetization of the first ferromagnetic layer 11 comes to be −X direction. The direction of magnetization of the second ferromagnetic layer 13 is kept in the −X direction set as the direction of initialization magnetization. Hence, the relationship in magnetization direction between the first ferromagnetic layer and the second ferromagnetic layer changes from antiparallel to parallel in accordance with the changes in word electric current. Thus, the changes in resistance that are observable in line with the word electric current generating the magnetic field in the +X direction and then in the −X direction appear as changes from a high resistance to a low resistance. This is the state of "0".

In the case of "1", the word electric current is flowed in the order of the arrows 101a and 101b like the case of "0", whereupon the magnetic field generated changes in the order of the arrows 102a and 102b, and the direction of magnetization of the first ferromagnetic layer 11 changes from +X to −X directions. Since the direction of magnetization of the second ferromagnetic layer 13 is the +X direction in the case of "1", the relationship in magnetization direction between the first ferromagnetic layer and the second ferromagnetic layer changes from parallel to antiparallel in accordance with the changes in word electric current. Thus, the changes in resistance that are observable appear as changes from a high resistance to a low resistance in line with the word electric current generating the magnetic field in the +X direction and then in the −X direction. This is the state of "1".

The reproducing method of the present invention, i.e., the reproduction using the pulse electric current of any one of positive and negative is described below. Since signals can be detected using the electric current pulse generating the magnetic field opposite to the direction of initialization magnetization even without shifting the word electric current to positive and negative, a word electric current that generates the magnetic field in the +X direction may be flowed. Referring to the direction of magnetization, it corresponds, in FIG. 1, to the direction shown by the arrow 102a; referring to the word electric current, the direction shown by the arrow 102a.

In the case of "0", the direction of magnetization of the second ferromagnetic layer 13 is the −X direction. The word electric current is flowed in the direction of the arrow 101a, whereupon the first ferromagnetic layer 11 is magnetized in the +X direction. On the other hand, when the word electric current, 101a, is not flowed, the direction of magnetization of the first ferromagnetic layer 11 is the same −X direction as that of both the adjoining magnetization-fixing layers 21 and 31 because the direction of magnetization of the magnetization-fixing layers 20 and 30 surrounding the first ferromagnetic layer 11 is the −X direction. Hence, at the time of "0", the presence or absence of word electric current causes a change form a high resistance to a low resistance. This indicates "0".

In the case of "1", the direction of magnetization of the second ferromagnetic layer 13 is the +X direction. The word electric current is flowed in the direction of the arrow 101a, whereupon the first ferromagnetic layer 11 is magnetized in the +X direction. On the other hand, when the word electric current 101a is not flowed, the direction of magnetization of the first ferromagnetic layer 11 is the same −X direction as that of both the adjoining magnetization-fixing layers 21 and 31. This is because the magnetization-fixing layers 20 and 30 surrounding the first ferromagnetic layer 11 have a stronger magnetic coupling force than the second ferromagnetic layer 13 magnetized in the +X direction. Hence, at the time of "1", the presence or absence of word electric current causes a change form a low resistance to a high resistance. This indicates "1".

In short, in conventional reproducing methods the direction of magnetization of the first ferromagnetic layer 11 is reversed by applying two positive and negative electric current pulses, whereas, in the reproducing method of the present invention the direction of magnetization of the first ferromagnetic layer 11, having temporarily been reversed using a positive or negative electric current pulse, is brought back to the original state by the action of the magnetization-fixing layers described above. Thus, the signals of "0" and "1" can be read.

Figure 11A:
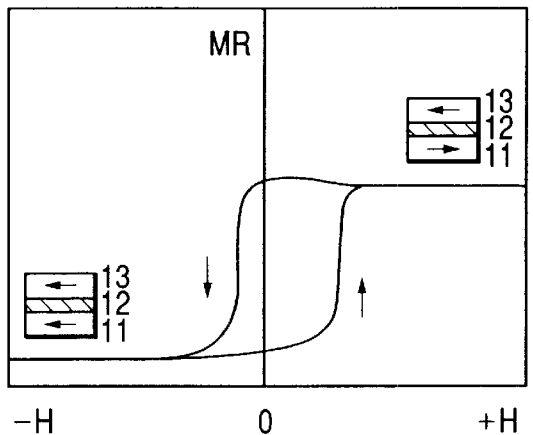
FIGS. 11A and 11B diagrammatically illustrate hysteresis loops of a magnetic field/MR ratio in a conventional MRAM.
Figure 11B:
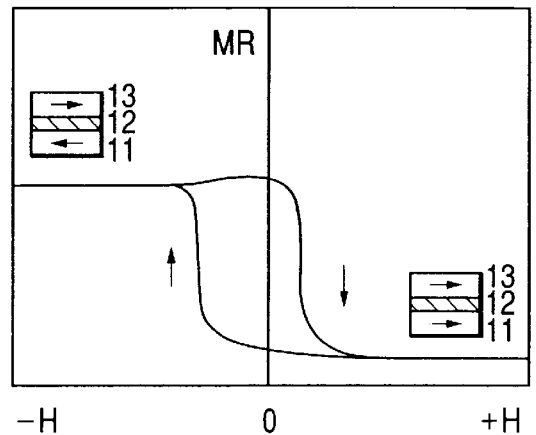

The difference between the reproducing method in MRAM according to the present invention and the conventional reproducing method in MRAM provided with no magnetization-fixing layer is further detailed with reference to graphs of hysteresis loops of a magnetic field/MR ratio. FIGS. 11A and 11B show hysteresis loops in the case provided with no magnetization-fixing layer, which corresponds to the conventional reproducing method. FIG. 11A corresponds to a state where "0" has been recorded in the second ferromagnetic layer 13, and FIG. 11B a state where "1" has been recorded in that layer 13. Here, the width of magnetic field strength +H or −H applied at the time of reproduction is larger than the coercive force of the first ferromagnetic layer 11, but at a level smaller than the coercive force of the second ferromagnetic layer 13. Incidentally, at both margins in each drawing, views are added which diagrammatically show the state of magnetization of each magnetic layer at the maximum value of the magnetic field strength +H or −H. Also, the respective layers of the memory are shown by reference numerals. In the hysteresis loops, course directions of hysteresis are also indicated by arrows similarly. Upon application of a +H magnetic field to "0" in FIG. 11A, the magnetization of the first ferromagnetic layer 11 is reversed to bring about a high-resistance state (high MR) where the directions of magnetization of both the ferromagnetic layers has turned antiparallel. Residual magnetization remains even when the magnetic field is returned to zero from this state, and hence the antiparallel state is kept. To return it to a parallel low-resistance state (low MR), a magnetic field must be generated in −H direction. On the other hand, considering a state where "1" has been recorded in the second ferromagnetic layer 13, as shown in FIG. 11B the magnetization of the first ferromagnetic layer 11 is reversed upon application of a −H magnetic field, so that the directions of magnetization of both the ferromagnetic layers turn antiparallel. Thereafter, to return it to the parallel state, a magnetic field in +H direction must be applied. Namely, in the conventional MRAM, magnetic fields in both +H and −H directions must be generated using both positive and negative electric current pulses at the time of reproduction before the phenomenon can be recognized where changes in rise of magnetoresistance signals stand reversed between "0" and "1".

Figure 12A:
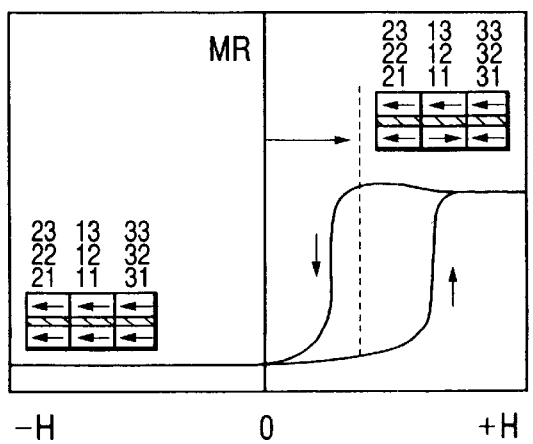
FIGS. 12A and 12B diagrammatically illustrate hysteresis loops of a magnetic field/MR ratio in the MRAM of the present invention.
Figure 12B:
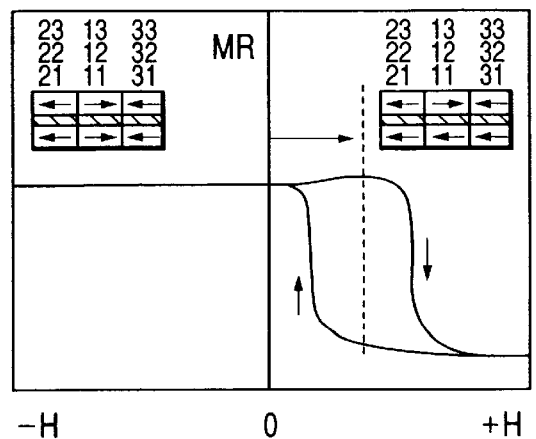

FIGS. 12A and 12B show hysteresis loops of a magnetic field/MR ratio at the time of reproduction in the MRAM of the present invention, provided with the magnetization-fixing layers. When the magnetic field of +H direction is generated, in the MRAM shown in FIG. 1, the electric current in the direction of the arrow 101a is flowed through the conductor wire 51. FIG. 12A corresponds to a state where "0" has been recorded in the second ferromagnetic layer 13, and FIG. 12B a state where "1" has been recorded in that layer 13. At both margins in each drawing, views are added which diagrammatically show the state of magnetization of each magnetic layer at the maximum value of the magnetic field strength +H or −H. Also, the respective layers of the memory are shown by reference numerals. In the hysteresis loops, course directions of hysteresis are also indicated by arrows similarly. In the hysteresis loops of the MRAM of the present invention, the loops shift to the +H direction compared with those in FIGS. 11A and 11B, on account of the effect attributable to the magnetization-fixing layers 20 (21, 22, 23) and 30 (31, 32, 33). Stated specifically, the middle of hysteresis (shown by a dotted line in each of FIGS. 12A and 12B) stands locally shifted to the +H direction by the amount of shift shown by an arrow. Accordingly, where once a magnetic field in the +H direction is applied and thereafter returned to the zero magnetic field, the magnetization of the first ferromagnetic layer 11 returns to the original state by the action of the magnetization of the magnetization-fixing layers. More specifically, in the state where "0" has been recorded in the second ferromagnetic layer 13 (FIG. 12A), the +H magnetic field is applied and thereafter returned to the zero magnetic field, whereupon a change from a high resistance to a low resistance takes place (high→low MR). In the state where "1" has been recorded in the second ferromagnetic layer 13 (FIG. 12B), the +H magnetic field is applied and thereafter returned to the zero magnetic field, whereupon a change from a low resistance to a high resistance takes place (low→high MR). Thus, the phenomenon can be recognized where changes in rise of signals reverse between "0" and "1", i.e., recorded signals can be reproduced, using only an electric current pulse generating the magnetic field in the +H direction.

Figure 9A:
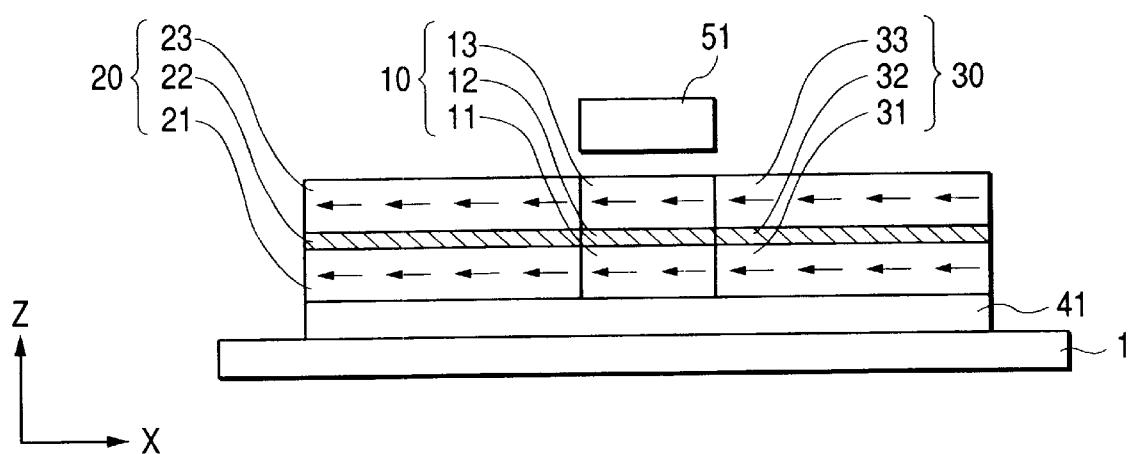
FIGS. 9A and 9B diagrammatically illustrate the state of magnetization when an electric current magnetic field is approximately 0, in the MRAM (spin dependent scattering type) in Example 1 of the present invention.
Figure 9B:
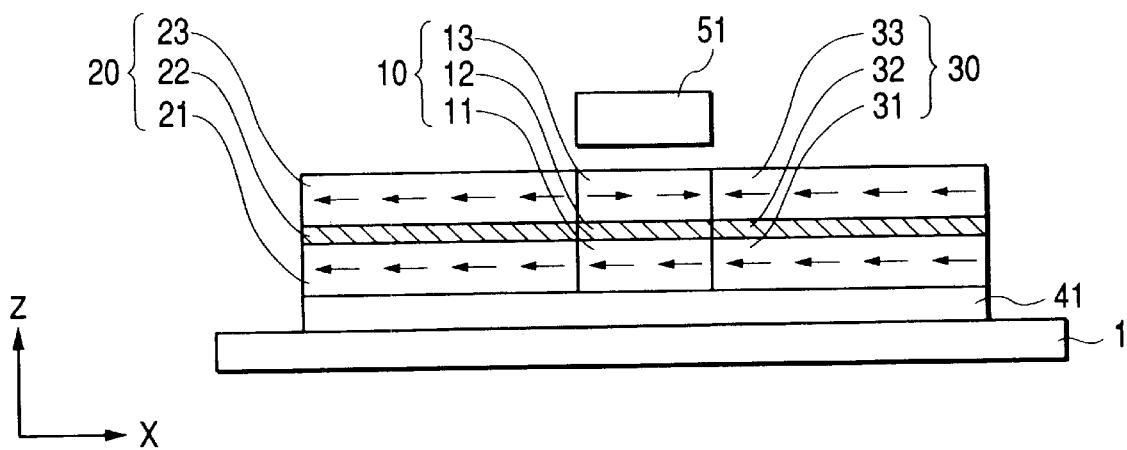

FIGS. 9A and 9B are cross-sectional views diagrammatically showing the state of magnetization of the first ferromagnetic layer and second ferromagnetic layer when an electric current magnetic field generated by word electric current is made approximately zero in the MRAM of the present invention, constructed as shown in FIG. 1. FIG. 9A shows a state where "0" has been recorded in the second ferromagnetic layer 13; and FIG. 9B, a state where "1" has been recorded in that layer 13. The direction of magnetization of the first ferromagnetic layer 11 is the same direction of initialization magnetization as those of the magnetization-fixing layers 20 and 30 which hold the layer 11 on the right and left sides. Upon application of pulsewise word electric current from this state, directed from the back to the front as viewed on the drawing, the direction of magnetization of the first ferromagnetic layer 11 is reversed only during its application, and hence signals can be reproduced.

Figure 2:
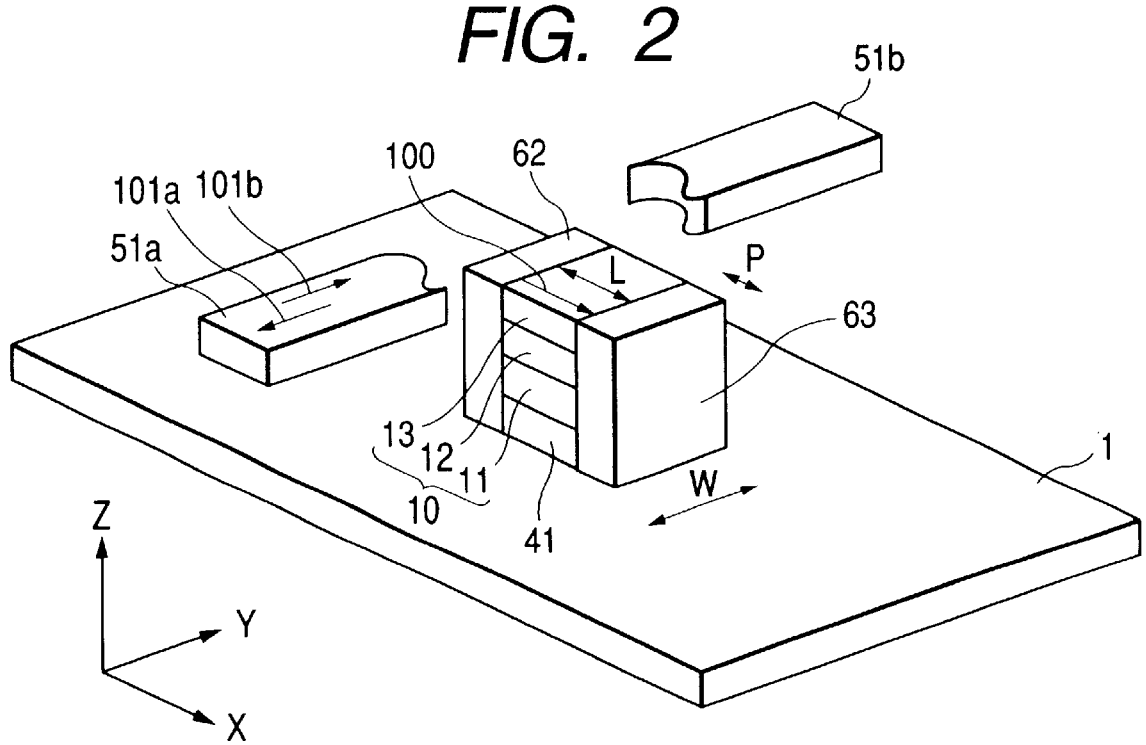
FIG. 2 is a perspective view diagrammatically showing an example of the construction of an MRAM (spin dependent scattering type) of the present invention, provided with a magnetization-fixing layer having layer constitution different from that of the magnetoresistance film, formed of a magnetic material other than a spin dependent scattering film.

The magnetization-fixing layers are by no means limited to the spin dependent scattering film shown in FIG. 1. It is also possible to use, as shown in FIG. 2, magnetization-fixing layers 62 and 63 formed of a magnetic material different from that of the magnetoresistance film. Where such magnetization-fixing layers having a layer constitution different from that of the magnetoresistance film, the length P can be made smaller in extent than the case where the spin dependent scattering film is used. In such a case, the length P can be made small by replacing the magnetic material with a magnetic material having in a smaller volume the same magnetization as the magnetization-fixing layers 20 and 30 formed of the spin dependent scattering films having the length P, thus the degree of integration can be made higher. The relationship between the length P of a magnetization-fixing layer and the length L of a magnetoresistance film may appropriately be adjusted by changing the magnetic material used, the layer constitution and so forth and in accordance with the values of any one of positive and negative pulsewise electric currents used at the time of reproduction.

In these embodiments, the magnetoresistance film and the magnetization-fixing layers are provided in contact at a very close proximity, where the magnetic coupling force is predominantly an exchange coupling force.

Figure 3:
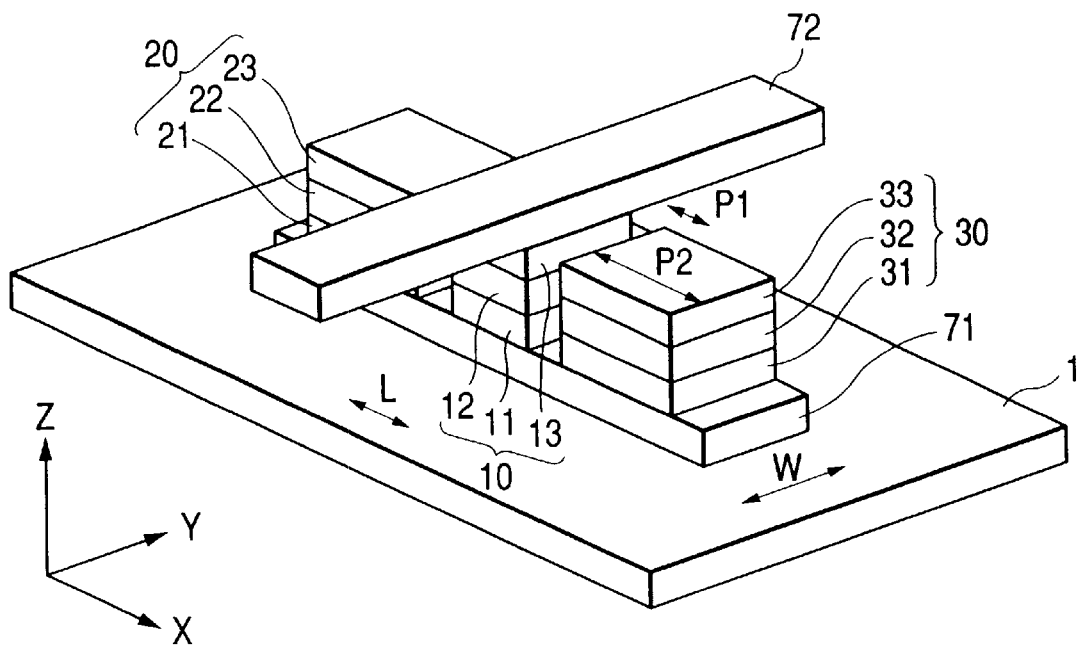
FIG. 3 is a perspective view diagrammatically showing an example of the construction of an MRAM (spin dependent tunneling type) of the present invention, provided with a magnetization-fixing layer having the same layer constitution as the magnetoresistance film.

The operation or function of the magnetization-fixing layer described above is by no means attributable only to the spin dependent scattering film, and principally the same operation is obtainable also when applied to different types of MRAM. For example, in the case when a spin dependent tunneling film of the in-plane magnetization film type is used in the memory cell structure, like the case of the spin dependent scattering film shown in FIG. 1, spin dependent tunneling films may be left continuously in the direction of a readily magnetizable axis of a sense wire as shown in FIG. 3, thus they can be used as magnetization-fixing layers 20 and 30. In such a case, the magnetization-fixing layers must be provided leaving a space P1 in order to prevent electric current from flowing into adjacent memory cells.

Figure 4:
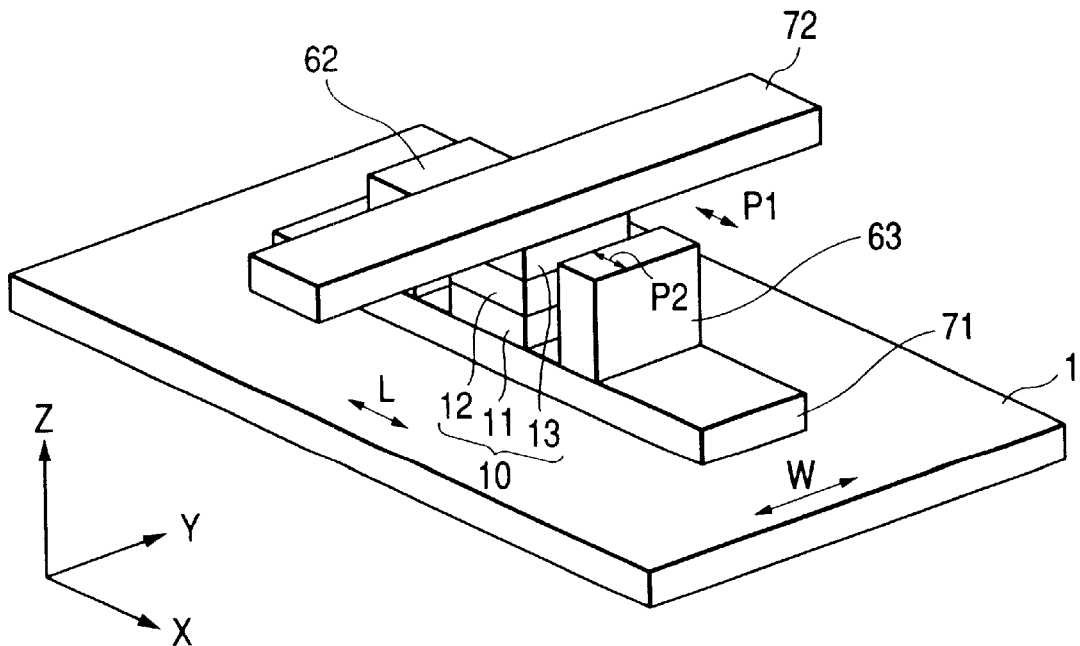
FIG. 4 is a perspective view diagrammatically showing an example of the construction of an MRAM (spin dependent tunneling type) of the present invention, provided with a magnetization-fixing layer having layer constitution different from that of the magnetoresistance film, formed of a magnetic material other than a spin dependent tunneling film of the magnetoresistance film.
Figure 5A:
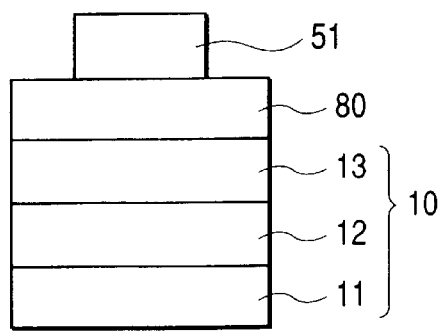
FIGS. 5A, 5B, 5C, 5D, 5E, 5F and 5G are diagrammatic views with reference to which the operating principle of the MRAM of the present invention is described.
Figure 5B:
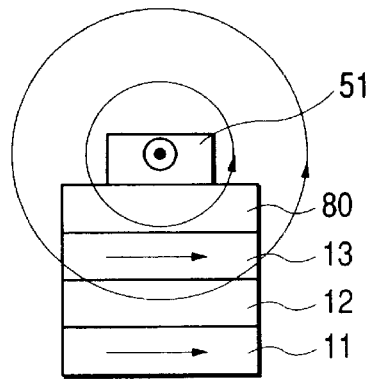
Figure 5C:
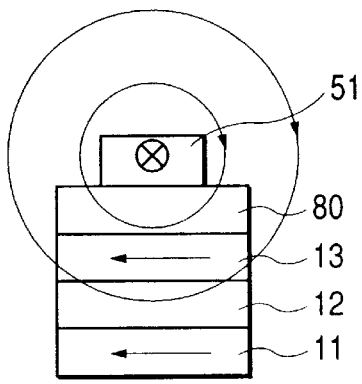
Figure 5D:
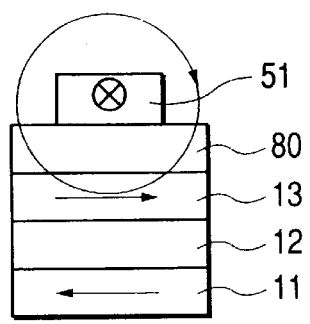
Figure 5E:
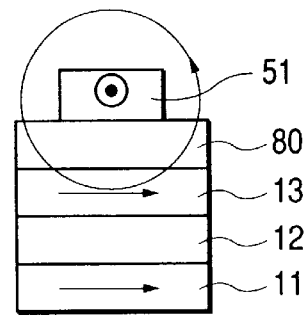
Figure 5F:
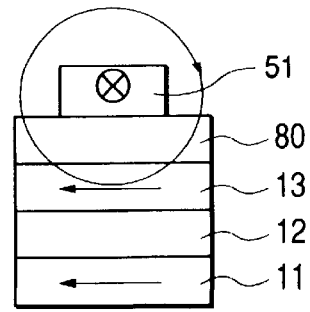
Figure 5G:
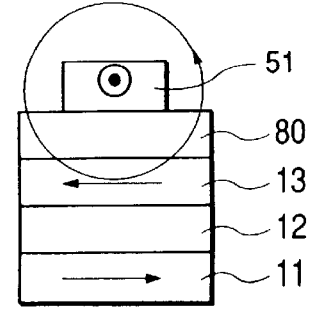
Figure 6A:
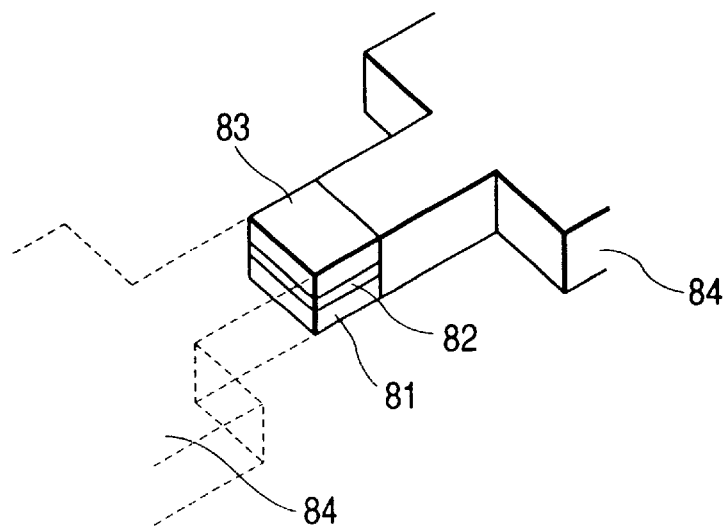
FIGS. 6A and 6B are perspective views diagrammatically showing the CIP structure (FIG. 6A) and the manner of conduction of sense electric current in the CPP structure (FIG. 6B)
Figure 6B:
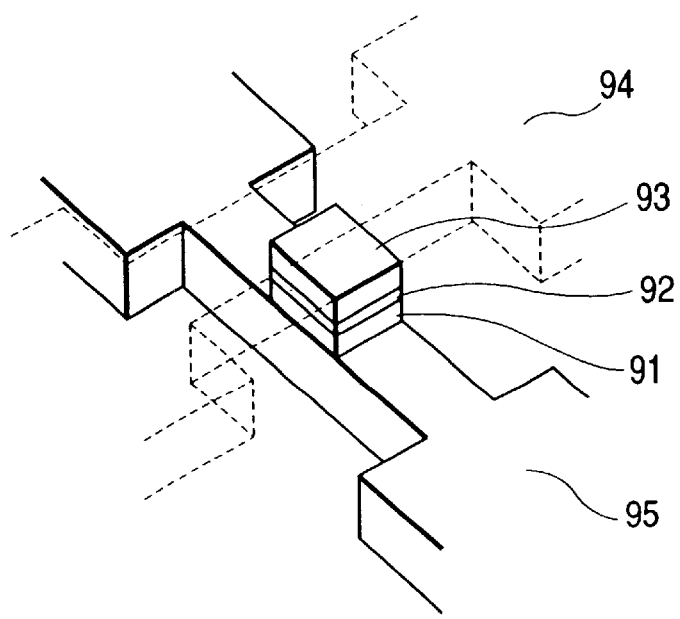

Without use of the spin dependent tunneling films as the magnetization-fixing layers, as shown in FIG. 4 magnetization-fixing layers 62 and 63 may also be provided which are formed of a magnetic material different from that of the magnetoresistance film. In such a case, the length P2 can be made small by replacing the magnetic material with a magnetic material by which the same operation as the magnetization-fixing layers 20 and 30 formed of the spin dependent tunneling films having the length P2 as shown in FIG. 3 can be achieved in a smaller volume. This can make narrow the distance (P1+P2+P1) between adjacent memory cells, thus the degree of integration can be made much higher. In the construction where the spin dependent tunneling film is used in the magnetoresistance film, too, the relationship between the distance P1, the length P2 of a magnetization-fixing layer and the length L of a magnetoresistance film may appropriately be adjusted by changing the magnetic material used, the layer constitution and so forth and in accordance with the values of any one of positive and negative pulsewise electric currents used at the time of reproduction. Incidentally, the effect of the magnetization-fixing layer is not achievable when the distance P1 is too large, and hence P2>>P1 is set up in usual cases. Hence, like the length P of a magnetization-fixing layer in the spin dependent scattering type, the length P2 of a magnetization-fixing layer corresponds to the distance between substantially adjacent memory cells also in the spin dependent tunneling type.

In these embodiments, because of the positional relationship between the magnetoresistance film and the magnetization-fixing layer, the magnetic coupling force is predominantly a magnetostatic coupling force. Incidentally, by adjusting a constitution and kind of material of the magnetization-fixing layer, in place of the magnetostatic coupling force, it can also predominantly be a bias force attributable to a floating magnetic field. In such a case, the magnetization of the reproducing layer is oriented to the bias direction attributable to the bias force.

Where memory cells are arranged in a matrix, the magnetization-fixing layers are not layers acting only on one memory cell, and bring about a like effect also on adjoining memory cells. FIG. 10 shows another example in which the spin dependent tunneling film is provided with magnetization-fixing layers formed of a different magnetic material, which is an example of construction where the magnetoresistance films are formed in a 3×3 memory array. In FIG. 10, reference numerals and names relating to component parts not referred to in the description are omitted. Also, since the interior must be made visible for convenience of description, a conductor wire to be positioned on magnetoresistance films 103, 203, 303 is omitted. Originally, a conductor wire is disposed also on the magnetoresistance films 103, 203, 303 in parallel to conductor wires 701 and 702. For example, a magnetization-fixing layer 623 so functions that a magnetic coupling force by which the direction of initialization magnetization has been fixed acts on both the magnetoresistance films 203 and 202. In addition, though weakly, a magnetic coupling force by which the direction of initialization magnetization has been fixed also acts on the surrounding magnetoresistance films 102, 103, 302 and 303.

In the MRAM of the present invention, non-magnetic material substrates having a high flatness, such as silicon wafers, quartz substrates and SOI (silicon-on-insulator) substrates are usable as the substrate. The SOI substrates may be prepared by using various methods such as the ELTRAN method and the SIMOX method. Here, the crystal direction of silicon at the substrate surface may preferably be (100).

Where the magnetoresistance film is formed on the substrate, the buffer layer is inserted for the purpose of controlling surface free energy of the plane lower than the first ferromagnetic layer to materialize a interfacial structure having a higher flatness. Various metals such as Ta, Cu and Cr or insulators such as SiN, $SiO_2$ and $Al_2O_3$ are usable. The buffer layer need not be inserted, depending on the manner of selecting substrate materials and materials for the magnetoresistance film. The buffer layer may preferably have a layer thickness in the range of from 2 nm to 10 nm. This is because a buffer layer thinner than 2 nm may cause a problem of non-uniform film quality due to islanded growth depending on film formation processes and on the other hand a buffer layer thicker than 10 nm may cause a problem of a low productivity.

In the case of the spin dependent scattering film, a conductor is used to form the non-magnetic layer. For example, Cu, Ag, Au, Al or Mg may be used. Cu may more preferably be used. The non-magnetic layer may preferably have a layer thickness in the range of from 1 nm to 10 nm. This is because, if it has a thickness smaller than 1 nm, there is a possibility of causing pinholes due to islanded growth depending on film formation processes and no magnetoresistance may be brought about because of a mutual action of both magnetic layers and, if on the other hand it has a thickness larger than 10 nm, less spin dependent scattering may result because of a too broad distance between both magnetic layers with respect to electrons' mean free paths, resulting in a small magnetoresistance.

In the case of the spin dependent tunneling film, an insulator is used to from the non-magnetic layer. For example, oxides or nitrides of Al, Si, Cu or Mg may be used. An aluminum oxide may more preferably be used, as having a Fermi level close to other magnetic layers. The non-magnetic layer may preferably have a layer thickness in the range of from 0.5 nm to 5 nm. This is because, if it has a thickness smaller than 0.5 nm, there is a possibility of causing pinholes due to islanded growth depending on film formation processes and no magnetoresistance may be brought about because of a mutual action of both magnetic layers and, if on the other hand it has a thickness larger than 5 nm, tunneling probability may lower because of a too broad distance between both magnetic layers with respect to electrons' mean free paths, resulting in a small magnetoresistance.

Combination of the first ferromagnetic layer with the second ferromagnetic layer which are constituent factors of the magnetoresistance film is comprised of a soft magnetic material and a hard magnetic material. Usable are not only combination in which the first ferromagnetic layer is a soft magnetic material layer and the second ferromagnetic layer is a hard magnetic material layer, but also combination in which the first ferromagnetic layer is a hard magnetic material layer and the second ferromagnetic layer is a soft magnetic material layer. The soft magnetic material makes magnetization reverse with ease, and hence its layer functions as the reproducing layer. The hard magnetic material makes magnetization reverse with difficulty compared with the soft magnetic material, and hence its layer functions as the memory layer. Incidentally, in the present invention, the distinction between the soft magnetic material and the hard magnetic material is defined by the relationship of magnitude of coercive force between the two ferromagnetic layers. A material having relatively larger coercive force is regarded as the hard magnetic material.

The first ferromagnetic layer and the second ferromagnetic layer are also indicative of functions. Each ferromagnetic layer itself may be a single layer formed of a single element, or may have a multi-layer structure of various alloys. For example, in order to make the layer function as a hard magnetic material layer, layers pinned up in a double-layer structure having a Co layer of 5 nm thick and an FeMn layer of 30 nm thick may be used as the first (or second) ferromagnetic layer. As materials for the first ferromagnetic layer and second ferromagnetic layer, usable are ferromagnetic materials such as Ni, Fe, Co, NiFe, NiFeCo, FeCo and CoFeB, and ferrimagnetic materials such as TbFe, TbFeCo and GdFe. Composition of these two ferromagnetic layers may appropriately be so adjusted as to provide different coercive forces. The first ferromagnetic layer and the second ferromagnetic layer may each preferably have a layer thickness selected in the range of from 2 nm to 100 nm.

In the case of perpendicular magnetization films, the direction of magnetization is the film-plane vertical direction that forms the greatest antimagnetic field in shape, thus they have already overcome the maximum coefficient of antimagnetic field at the time they exhibit the perpendicular magnetization anisotropy. Hence, the curling of spins may occur with difficulty even when devices are made very smaller. Also, it is unnecessary to make planar shape rectangular as in the case of in-plane magnetization films in order to prevent the curling. Thus, the perpendicular magnetization films are more advantageous than the in-plane magnetization films in order to make higher the degree of integration of memory cell areas.

Figure 13:
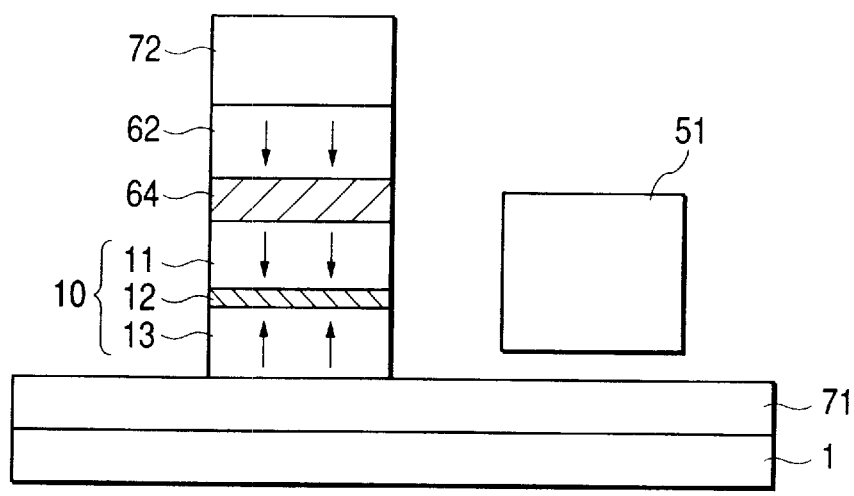
FIG. 13 is a cross-sectional view diagrammatically showing the construction of an MRAM having a spin dependent tunneling structure using a perpendicular magnetization film of the present invention.

FIG. 13 is a view diagrammatically showing an example of the construction of an MRAM having a spin dependent tunneling structure using a perpendicular magnetization film as the ferromagnetic layer. As shown in FIG. 13, a magnetoresistance film 10 consisting of a first ferromagnetic layer 11, a non-magnetic layer 12 and a second ferromagnetic layer 13 is superposingly provided thereon with a non-magnetic layer 64 and a magnetization-fixing layer 62. Between the substrate 1 and the magnetoresistance film 10, a conductor wire 71 is provided, and on the magnetization-fixing layer 62 a conductor wire 72 is provided, which function as a lower sense wire and an upper sense wire, respectively. When signals are reproduced, sense electric current is flowed across the conductor wire 71, magnetoresistance film 10, non-magnetic layer 64, magnetization-fixing layer 62 and conductor wire 72. A conductor wire 51 is provided via an insulating film (not shown), and functions as a word wire which generates an electric current magnetic field in the vicinity of the magnetoresistance film. As long as the first ferromagnetic layer 11 and the magnetization-fixing layer 62 are positionally close to each other, the magnetoresistance film and the magnetization-fixing layer may be superposed in reverse order.

In FIG. 13, diagrammatically represented using arrows is a manner in which the direction of magnetization of the first ferromagnetic layer 11 has been fixed to the same direction by the action of the magnetization-fixing layer 62 in the state where the electric current magnetic field is approximately zero. The arrows shown in the magnetization-fixing layer 62, the first ferromagnetic layer 11 and second ferromagnetic layer 13 indicate their respective directions of magnetization. When signals are reproduced, the direction of magnetization of the first ferromagnetic layer 11 is reversed by means of a synthesized magnetic field of a magnetic field generated by word electric current flowed through the conductor wire 51 and a magnetic field generated by sense electric current, and the state of "0" or "1" can be recognized in combination with the direction of magnetization of the second ferromagnetic layer 13. In such a case, the magnitude of magnetic coupling force acting between the magnetization-fixing layer 62 and the first ferromagnetic layer 11 is regulated by adjusting the thickness of the non-magnetic layer 64. The non-magnetic layer 64 may preferably have a layer thickness selected in the range of from 2 nm to 20 nm. This is because, if it has a thickness smaller than 2 nm, a too great magnetic coupling force may act between the magnetization-fixing layer 62 and the first ferromagnetic layer 11 to generate a too large word electric current necessary for reproduction, depending on materials of the magnetization-fixing layer 62. If on the other hand it has a thickness larger than 20 nm, the effect attributable to the magnetization-fixing layer 62 may be obtained with difficulty, making it necessary to enlarge the volume of the magnetization-fixing layer 62 so as to be more magnetized or to replace the magnetic material with a material more magnetizable per unit volume.

In the case when the perpendicular magnetization film is used, too, signals can be reproduced using only a positive or negative electric current pulse generating the magnetic field opposite to the direction of initialization magnetization that has previously been set by applying an external magnetic field, even without shifting the word electric current to both directions of positive and negative.

The magnetoresistance film consisting of the first ferromagnetic layer/non-magnetic layer/second ferromagnetic layer functions as a memory cell. The size of its junction area is appropriately determined in accordance with processes used or purposes for its use. Since the resistivity standardized by the area of a magnetoresistance film is about $10^{-5} \Omega \cdot cm^2$, the junction area may preferably be 1 $\mu m^2$ or below which is adaptable to the value of on-resistance (several k$\Omega$) of a transistor that drives the memory cell.

For an insulating layer provided between the magnetoresistance film and the conductor wire provided thereon, usable are inorganic materials such as $SiO_2$, SiN and $Al_2O_3$ and organic materials such as novolak resins. The insulating layer may preferably have a layer thickness in the range of from 5 nm to 1,000 nm, which is determined by breakdown strength necessary for the electric power applied to the sense wire or word wire.

Information is written by means of a synthesized magnetic field of magnetic fields generated by word electric current and sense electric current. In the case of the spin dependent tunneling film, it is done by determining the direction of magnetization of the memory layer by means of an magnetic field generated using electric current flowed through any one or both of upper and lower sense wires. Alternatively, a magnetic field generated by word electric current of a word wire provided via an insulating layer may be used. In the case when the word wire is used, information can more surely be recorded.

For the conductor wire, usable are materials having a high electrical conductivity, such as Al, Cu and Au. The conductor wire may have a layer thickness selected in the range of from 100 nm to 1,000 nm, which is determined by electric current to be applied and line width. The conductor wire serves to record and reproduce information.

The above respective materials and layers can be processed or formed with ease by fine-processing patterning techniques typified by photolithography. In the step of film formation, known various methods are applicable such as vacuum deposition, sputtering and MBE (molecular beam epitaxy).

The present invention will be described below in greater detail by giving Examples. Incidentally, the following Examples are example of the best-mode embodiments of the present invention, but the present invention should by no means be construed limitative by these Examples.

EXAMPLE 1

FIG. 1 shows a structural example of the MRAM of the present invention, used in the present Example. In FIG. 1, shown is construction in which a spin dependent scattering type magnetoresistance film of the in-plane magnetization film type is used and magnetization-fixing layers having the same layer constitution as this magnetoresistance film are provided. A silicon wafer is used as the substrate 1; $Ni_{80}Fe_{20}$, as a material for the first ferromagnetic layers 11, 21 and 31; Cu, as a material for the non-magnetic layers 12, 22 and 32; and Co, as a material for the second ferromagnetic layers 13, 23 and 33. The layers 11, 12 and 13 are combined to form a magnetoresistance film 10; the layers 21, 22 and 23, a magnetization-fixing layer 20; and the layers 31, 32 and 33, a magnetization-fixing layer 30. SiN is used as a material for the buffer layer 41; and Al, for the conductor wire 51. The conductor wire 51 lies right above the magnetoresistance film 10 via an insulating layer (not shown) formed of SiN. In FIG. 1, it is illustrated dividedly into 51a and 51b so as to be easy to see.

Figure 7A:
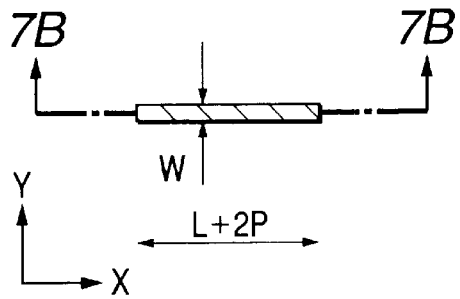
FIGS. 7A, 7B, 7C, 7D, 7E and 7F illustrate a fabrication process of an MRAM (spin dependent scattering type) in Example 1 of the present invention.
Figure 7B:
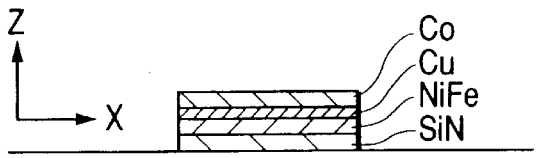
Figure 7C:
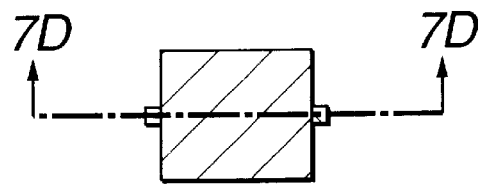
Figure 7D:
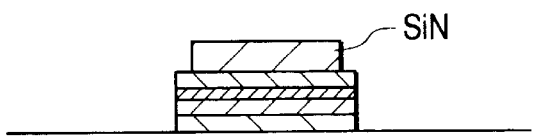
Figure 7E:
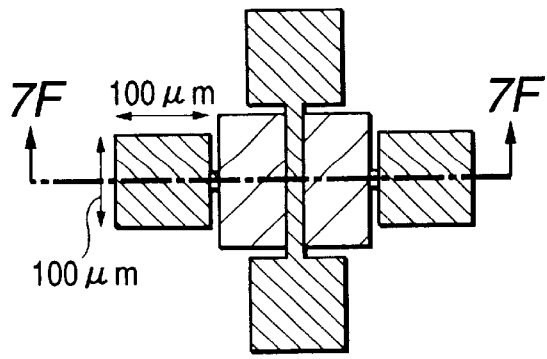
Figure 7F:
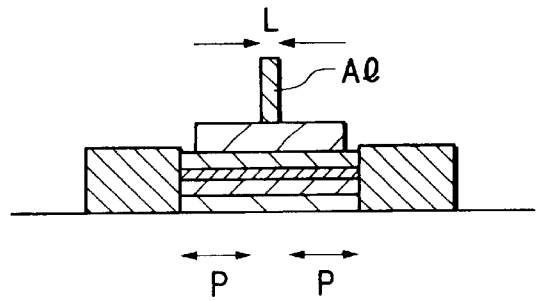

For device processing, a device pattern is formed using photolithography and lift-off procedure in combination. FIGS. 7A to 7F are views showing the procedure of that processing. FIGS. 7A and 7B, FIGS. 7C and 7D and FIGS. 7E and 7F are respectively set in pair. Being illustrated for each step, FIGS. 7A, 7C and 7E are its plan views, and FIGS. 7B, 7D and 7F are cross-sectional views along the lines X–X' in the plan views, respectively.

First, to form films in a device pattern having a length L+2P and a width W as shown in FIG. 7A, a resist mask having the corresponding shape is prepared by photolithography. The substrate provided with a film-forming mask is put in a sputtering reactor to form films. Under conditions of an ultimate pressure of $5 \times 10^{-5}$ Pa or below, an SiN film as the buffer layer 41, $Ni_{80}Fe_{20}$ films as the first ferromagnetic layers 11, 21 and 31, Cu films as the non-magnetic layers 12, 22 and 32 and Co films as the second ferromagnetic layers 13, 23 and 33 are formed in order. These films are formed in a thickness of 10 nm for the SiN film, 10 nm each for the $Ni_{80}Fe_{20}$ films, 5 nm each for the Cu films and 10 nm each for the Co films. Here, the $Ni_{80}Fe_{20}$ for the first ferromagnetic layers is a soft magnetic material, and the layers function as a reproducing layer. The Co for the second ferromagnetic layers is a hard magnetic material, and the layers function as a memory layer. At the time of film formation, a permanent magnet is so disposed that the films have like magnetic anisotropy in the direction of the substrate surface. Magnetic field strength produced by the permanent magnet was set at 20 Oe as measurement center. After the film formation, ultrasonic washing with acetone is carried out to remove any excess films deposited on the resist, simultaneously with the removal of the resist, followed by lift-off to obtain a stacked structure having a cross-sectional shape as shown in FIG. 7B.

Next, a resist mask is so prepared by photolithography as to form a insulating layer having a planar shape shown in FIG. 7C. The substrate provided with the mask and others is put in a sputtering reactor to form an SiN film in a thickness of 350 nm. After the film formation, ultrasonic washing with acetone is carried out to remove any excess SiN film deposited on the resist, simultaneously with the removal of the resist, followed by lift-off to obtain an SiN insulating film having a cross-sectional shape as shown in FIG. 7D.

Next, a resist mask is so prepared by photolithography as to form the conductor wire 51, and probe pads, having a planar shape shown in FIG. 7E. The substrate provided with the mask and others is put in a sputtering reactor to form an Al film in a thickness of 400 nm. After the film formation, ultrasonic washing with acetone is carried out to remove any excess Al film deposited on the resist, simultaneously with the removal of the resist, followed by lift-off to obtain the conductor wire 51, and probe pads, having a cross-sectional shape as shown in FIG. 7F, thus the desired device is completed. The Al film of 100 μm square so formed as to come in contact with both ends of the magnetoresistance film functions as pads on which a probe for measuring magnetoresistance is dropped.

The above fabrication process was repeated to prepare a large number of samples different in the length L in the direction of readily magnetizable axis of the sense wire, the length W in the direction of slightly magnetizable axis thereof and the length P of the magnetization-fixing layers present around it.

To memory devices fabricated through the process described above, access signals were sent to evaluate device characteristics. 5 mA of sense electric current was flowed, and changes in resistance of the magnetoresistance film were observed on an oscilloscope as variations in voltage. To eliminate any influences of residual resistance in the lead wire and of contact resistance between the pad and the probe, four-terminal measurement was employed to detect voltages, and voltage difference was measured using the differential function of the oscilloscope. To the word wire (conductor wire 51), rectangular-wave electric-current signals of 1 ms were inputted to reproduce and record information by means of a synthesized magnetic field of a magnetic field generated in accordance with word wire signals and a magnetic field generated by constant sense electric current.

Figure 8A:
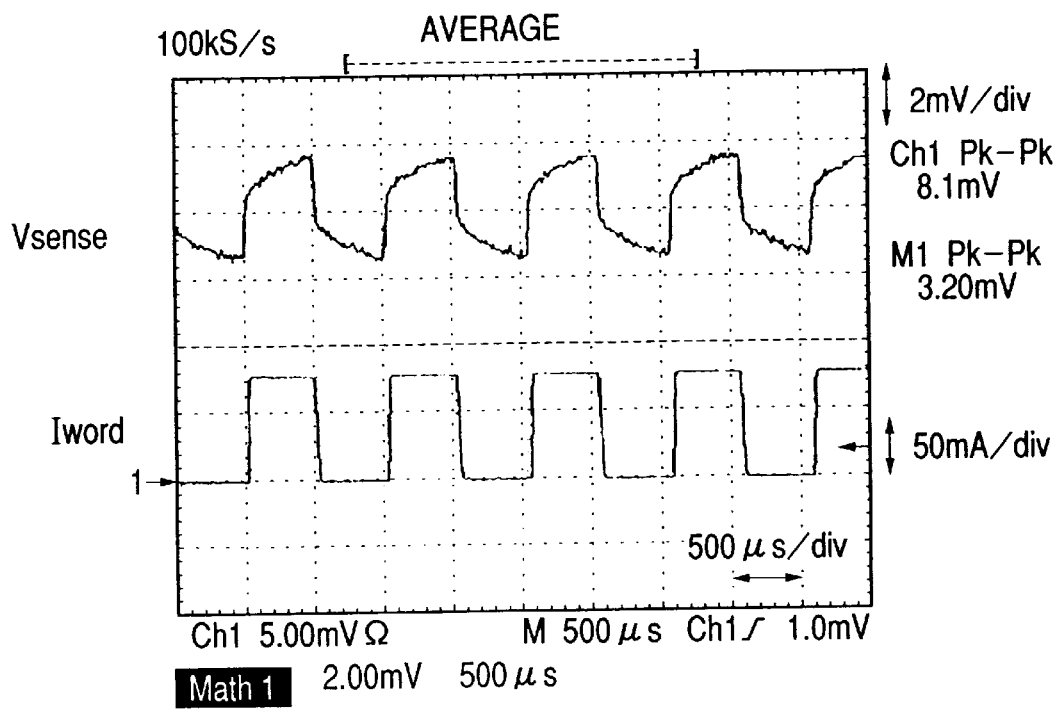
FIGS. 8A and 8B illustrate examples of signal waveforms at the time of reproduction in the MRAM (spin dependent scattering type) in Example 1 of the present invention.
Figure 8B:
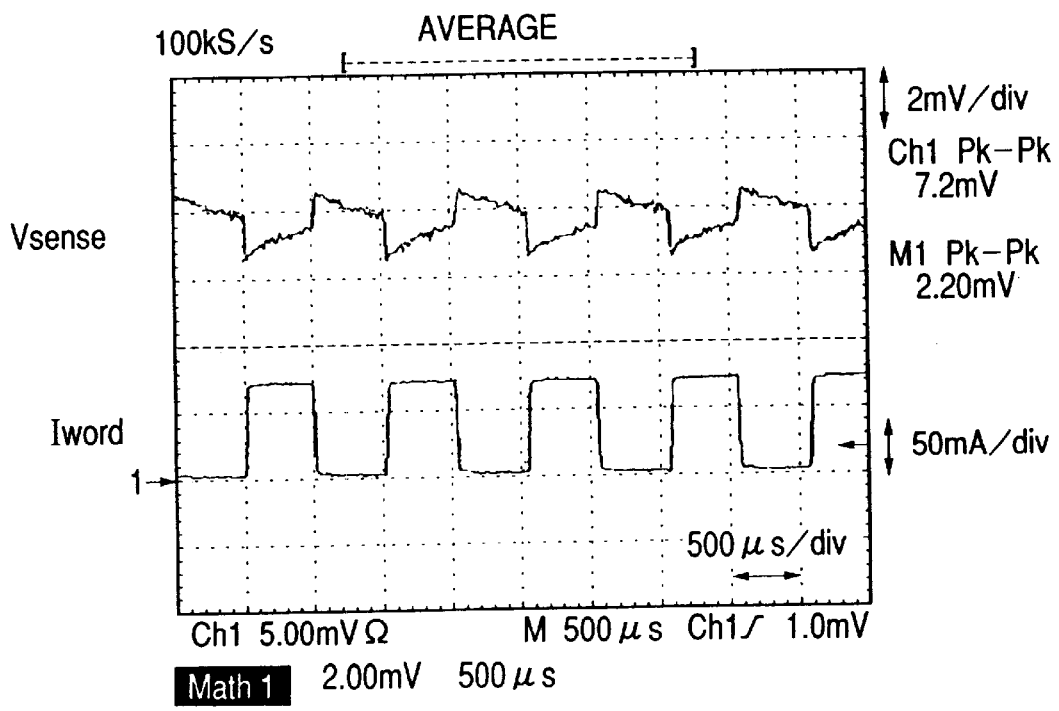

FIGS. 8A and 8B show examples of waveforms of word wire signals and of measurement of voltage variations corresponding to the changes in resistance of the magnetoresistance film, at the time of reproduction. FIGS. 8A and 8B show signal waveforms of "0" and "1", respectively, having been read on a device picked up under L=20 μm, W=20 μm, P=60 μm and P/L=3 and having been read under conditions of a sense electric current of 5 mA and a word electric current of 80 mA. The upper waveform shows sense voltage (corresponding to the change in resistance of the magnetoresistance film), and the lower waveform, change with time of the word electric current. The word electric current is read with an electric current probe, and coefficient of conversion is 100 mA=10 mV. In FIGS. 8A and 8B each, the waveform of the sense voltage changes in line with the recorded information "0" or "1", with only the word electric current on the plus side than the zero level of the word electric current shown by "1→" in the drawing. Thus the "0" or "1" can be recognized by differential detection of the rise of sense voltage.

A plurality of samples (memory devices) having different L and P were compared on whether or not signals were reproducible with only the electric current on the plus side, to obtain the results shown in Table 1.

As can be seen from the above results, signals can be reproduced with only the plus-side word electric current in devices having P/L of 2.5 or more. Thus, in these samples having P/L of 2.5 or more, signals can be reproduced without use of any bipolar power source.

TABLE 1

| P/L | P (μm) | L (μm) | ΔVs (mV) | Reproduction |
|---|---|---|---|---|
| 0.5 | 10 | 20 | — | Not reproducible |
| 1 | 20 | 20 | — | Not reproducible |
| 1.5 | 30 | 20 | — | Not reproducible |
| 2 | 40 | 20 | — | Not reproducible |
| 2.5 | 50 | 20 | 2.2 | Reproducible |
| 3 | 60 | 20 | 2.2 | Reproducible |
| 3.5 | 70 | 20 | 2.5 | Reproducible |
| 4 | 80 | 20 | 2.1 | Reproducible |
| 4.5 | 90 | 20 | 2.3 | Reproducible |
| 5 | 100 | 20 | 2.3 | Reproducible |

EXAMPLE 2

FIG. 2 shows another example of the MRAM of the present invention, used in the present Example. In the device construction shown in FIG. 2, a spin dependent scattering type magnetoresistance film of the in-plane magnetization film type is used and magnetization-fixing layers having layer constitution different from that of this magnetoresistance film are provided. Reference numeral 1 denotes a substrate; 11, a first ferromagnetic layer; 12, a non-magnetic layer; and 13, a second ferromagnetic layer. The layers 11, 12 and 13 are combined to form a magnetoresistance film 10. Reference numeral 41 denotes a buffer layer; and 51, a conductor wire. The conductor wire 51 lies right above the magnetoresistance film 10 via an insulating, layer (not shown). In FIG. 2, it is illustrated dividedly into 51a and 51b so as to be easy to see. Magnetization-fixing layers 62 and 63 are formed on the sidewalls of the magnetoresistance film 10 in the X direction in the drawing. In and from such a sample, information is recorded and reproduced by means of a synthesized magnetic field generated by a sense electric current flowed in the order of the magnetization-fixing layer 62, the magnetoresistance film 10 and the magnetization-fixing layer 63 in the direction of an arrow 100 and a word electric current flowed through the conductor wire 51 in the directions of arrows 101a and 101b.

Selecting the same materials and layer thickness as those in the memory device of Example 1 except that the material for the magnetization-fixing layers was changed to Co, a memory device was fabricated by sputtering film formation and lift-off procedure in combination in the same manner as in Example 1. Different from the memory device of Example 1, since the material for the magnetization-fixing layers is different from the material for the magnetoresistance film, the step of photolithography for forming the magnetization-fixing layers must be added once.

To a plurality of samples (memory devices) having different L and P, the sense electric current and the word electric current were applied in the same manner as in Example 1 to record and reproduce information, and inspection was made on whether or not signals were reproducible with only the electric current on the plus side.

Results obtained are shown in Table 2. It has been confirmed that, where the ferromagnetic material Co is used in the magnetization-fixing layers, signals can be reproduced with only the plus-side word electric current even under a smaller P/L than that in the device of Example 1 making use of magnetization-fixing layers having the same layer constitution as the magnetoresistance film. Thus, the present Example has proved to provide a structure that can make the length P of the magnetization-fixing layers smaller and can achieve a higher degree of integration. Desired characteristics can be obtained by appropriately selecting materials used in the magnetization-fixing layers and their layer thickness.

TABLE 2

| P/L | P (μm) | L (μm) | ΔVs (mV) | Reproduction |
|---|---|---|---|---|
| 0.5 | 10 | 20 | — | Not reproducible |
| 1 | 20 | 20 | 2.2 | Reproducible |
| 1.5 | 30 | 20 | 2.3 | Reproducible |
| 2 | 40 | 20 | 2.2 | Reproducible |
| 2.5 | 50 | 20 | 2.1 | Reproducible |
| 3 | 60 | 20 | 2.2 | Reproducible |
| 3.5 | 70 | 20 | 2.3 | Reproducible |
| 4 | 80 | 20 | 2.2 | Reproducible |
| 4.5 | 90 | 20 | 2.1 | Reproducible |
| 5 | 100 | 20 | 2.2 | Reproducible |

EXAMPLE 3

FIG. 3 shows still another example of the MRAM of the present invention, used in the present Example. In the device construction shown in FIG. 3, a spin-tunnel type magnetoresistance film using the in-plane magnetization film is used and magnetization-fixing layers having the same layer constitution as this magnetoresistance film are provided. Reference numeral 1 denotes a substrate; 11, 21 and 31, first ferromagnetic layers; 12, 22 and 32, non-magnetic layers; and 13, 23 and 33, second ferromagnetic layers. The layers 11, 12 and 13 are combined to form a magnetoresistance film 10; the layers 21, 22 and 23, a magnetization-fixing layer 20; and the layers 31, 32 and 33, a magnetization-fixing layer 30. Reference numerals 71 and 72 denote conductor wires. The conductor wire 71 is electrically connected to the first ferromagnetic layers 11, 21 and 31, and the conductor wire 72 to the second ferromagnetic layer 13. A word wire (not shown) is further provided on the conductor wire 72 via an insulating film (not shown) in the same direction as the conductor wire 72. The conductor wires 71 and 72 act as a lower sense wire and an upper sense wire, respectively, and sense electric current is flowed through these sense wires from the lower sense wire to the upper sense wire passing through the magnetoresistance film 10. Information is recorded and reproduced by means of a synthesized magnetic field generated by electric currents flowed through the sense wire and word wire.

For device processing, photolithography and lift-off procedure were used in combination. The length of the magnetoresistance film in the direction of readily magnetizable axis was set as L, its width as W, the distance between the magnetoresistance film 10 and the magnetization-fixing layer 30 (and the magnetization-fixing layer 20) in the X direction as P1, and the length of the magnetization-fixing layer 30 (and the magnetization-fixing layer 20) in the X direction as P2, where the lengths L, P1 and P2 were changed with respect to each width W to prepare a large number of samples.

To form films of respective materials, a sputtering reactor was used. Films were formed at an ultimate pressure of $5 \times 10^{-5}$ Pa or below to form an Al film as the conductor wire 71, $Ni_{80}Fe_{20}$ films as the first ferromagnetic layers 11, 21 and 31, AlOx films as the non-magnetic layers 12, 22 and 32, Co films as the second ferromagnetic layers 13, 23 and 33, an SiN film as the insulating film, and an Al film as the conductor wire 72. These films are formed in a thickness of 25 nm for the conductor wire 71 Al film, 25 nm each for the first ferromagnetic layers $Ni_{80}Fe_{20}$ films, 1.2 nm each for the non-magnetic layers AlOx films, 25 nm each for the second ferromagnetic layers Co films, 50 nm for the conductor wire 72 Al film and 110 nm for the insulating film SiN film. Here, the $Ni_{80}Fe_{20}$ for the first ferromagnetic layers is a soft magnetic material, and the layers function as a reproducing layer. The Co for the second ferromagnetic layers is a hard magnetic material, and the layers function as a memory layer. In the formation of the non-magnetic layer AlOx films, Al was first deposited by sputtering and thereafter oxygen was introduced into the reactor, followed by leaving at 1,000 Pa for 125 minutes to form AlOx oxide films. After the aluminum oxide films were formed, evacuation was made up to a predetermined ultimate pressure to remove the oxygen introduced, and then the next Co films were formed. At the time of film formation, a permanent magnet is so disposed that the films have like magnetic anisotropy in the direction of the substrate surface. Magnetic field strength produced by the permanent magnet is set at 20 Oe as measurement center.

To a plurality of samples (memory devices) having different L, P1 and P2, the sense electric current and the word electric current were applied in the same manner as in Example 1 to record and reproduce information, and inspection was made on whether or not signals were reproducible with only the electric current on the plus side.

Results obtained are shown in Table 3. It has been confirmed that, where the magnetization-fixing layers 62 and 63 are provided and P2/L is set at 2.5 or more, signals can be reproduced with only the plus-side electric current also in the construction making use of the spin dependent tunneling type magnetoresistance film.

TABLE 3

| P2/L | P2 (μm) | P1 (μm) | L (μm) | ΔVs (mV) | Reproduction |
|---|---|---|---|---|---|
| 0.5 | 10 | 0.5 | 20 | — | Not reproducible |
| 1 | 20 | 0.5 | 20 | — | Not reproducible |
| 1.5 | 30 | 0.5 | 20 | — | Not reproducible |

TABLE 3-continued

| P2/L | P2 (μm) | P1 (μm) | L (μm) | ΔVs (mV) | Reproduction |
|---|---|---|---|---|---|
| 2 | 40 | 0.5 | 20 | — | Not reproducible |
| 2.5 | 50 | 0.5 | 20 | 7.1 | Reproducible |
| 3 | 60 | 0.5 | 20 | 7.2 | Reproducible |
| 3.5 | 70 | 0.5 | 20 | 7.5 | Reproducible |
| 4 | 80 | 0.5 | 20 | 7.5 | Reproducible |
| 4.5 | 90 | 0.5 | 20 | 7.7 | Reproducible |
| 5 | 100 | 0.5 | 20 | 7.5 | Reproducible |

EXAMPLE 4

FIG. 4 shows still another example of the MRAM of the present invention, used in the present Example. In the device construction shown in FIG. 4, a spin dependent tunneling type magnetoresistance film of the in-plane magnetization film type is used and magnetization-fixing layers having layer constitution different from that of this magnetoresistance film are provided. Reference numeral 1 denotes a substrate; 11, a first ferromagnetic layer; 12, a non-magnetic layer; and 13, a second ferromagnetic layer. The layers 11, 12 and 13 are combined to form a magnetoresistance film 10. Magnetization-fixing layers 62 and 63 are formed on the sidewalls of the magnetoresistance film 10 in the X direction of in the drawing. Reference numerals 71 and 72 denote conductor wires. The conductor wire 71 is electrically connected to the first ferromagnetic layer 11, and the conductor wire 72 to the second ferromagnetic layer 13. A word wire (not shown) is further provided on the conductor wire 72 via an insulating film (not shown) in the same direction as the conductor wire 72. The conductor wires 71 and 72 act as a lower sense wire and an upper sense wire, respectively, and sense electric current is flowed through these sense wires from the lower sense wire to the upper sense wire passing through the magnetoresistance film 10. Information is recorded and reproduced by means of a synthesized magnetic field generated by electric currents flowed through the sense wire and word wire.

For device processing, photolithography and lift-off procedure were used in combination. The length of the magnetoresistance film in the direction of readily magnetizable axis was set as L, its width as W, the distance between the magnetoresistance film 10 and the magnetization-fixing layer 63 (and the magnetization-fixing layer 62) in the X direction as P1, and the length of the magnetization-fixing layer 63 (and the magnetization-fixing layer 62) in the X direction as P2, where the lengths L, P1 and P2 were changed with respect to each width W to prepare a large number, of samples.

Selecting the same materials and layer thickness as those in the memory device of Example 3 except that the material for the magnetization-fixing layers was changed to Co, a memory device was fabricated by sputtering film formation and lift-off procedure in combination in the same manner as in Example 3. Different from the memory device of Example 3, since the material for the magnetization-fixing layers is different from the material for the magnetoresistance film, the step of photolithography for forming the magnetization-fixing layers must be added once.

To a plurality of samples (memory devices) having different L, P1 and P2, the sense electric current and the word electric current were applied in the same manner as in Example 1 to record and reproduce information, and inspection was made on whether or not signals were reproducible with only the electric current on the plus side.

Results obtained are shown in Table 4. It has been confirmed that, where the magnetization-fixing layers 62 and 63 are provided and P2/L is set at 1.5 or more, signals can be reproduced with only the plus-side electric current. Where the distance P1 between the magnetoresistance film using the spin dependent tunneling type magnetoresistance film is identical, it is confirmed that, in the present Example, making use of the ferromagnetic material Co in the magnetization-fixing layers, signals can be reproduced with only the plus-side electric current even when the length P2 of the magnetization-fixing layers is smaller than the length P of Example 3 making use of magnetization-fixing layers having the same layer constitution as the magnetoresistance film. Thus, the present Example has proved to provide a structure that can make small the distance between adjacent magnetoresistance films (P1+P2+P1) and can achieve a higher degree of integration. Desired characteristics can be obtained by appropriately selecting materials used in the magnetization-fixing layers and their layer thickness.

TABLE 4

| P2/L | P2 (μm) | P1 (μm) | L (μm) | ΔVs (mV) | Reproduction |
|---|---|---|---|---|---|
| 0.5 | 10 | 0.5 | 20 | — | Not reproducible |
| 1 | 20 | 0.5 | 20 | — | Not reproducible |
| 1.5 | 30 | 0.5 | 20 | 7.2 | Reproducible |
| 2 | 40 | 0.5 | 20 | 6.9 | Reproducible |
| 2.5 | 50 | 0.5 | 20 | 7.5 | Reproducible |
| 3 | 60 | 0.5 | 20 | 7.1 | Reproducible |
| 3.5 | 70 | 0.5 | 20 | 7.5 | Reproducible |
| 4 | 80 | 0.5 | 20 | 7.2 | Reproducible |
| 4.5 | 90 | 0.5 | 20 | 7.3 | Reproducible |
| 5 | 100 | 0.5 | 20 | 7.4 | Reproducible |

EXAMPLE 5

Figure 14:
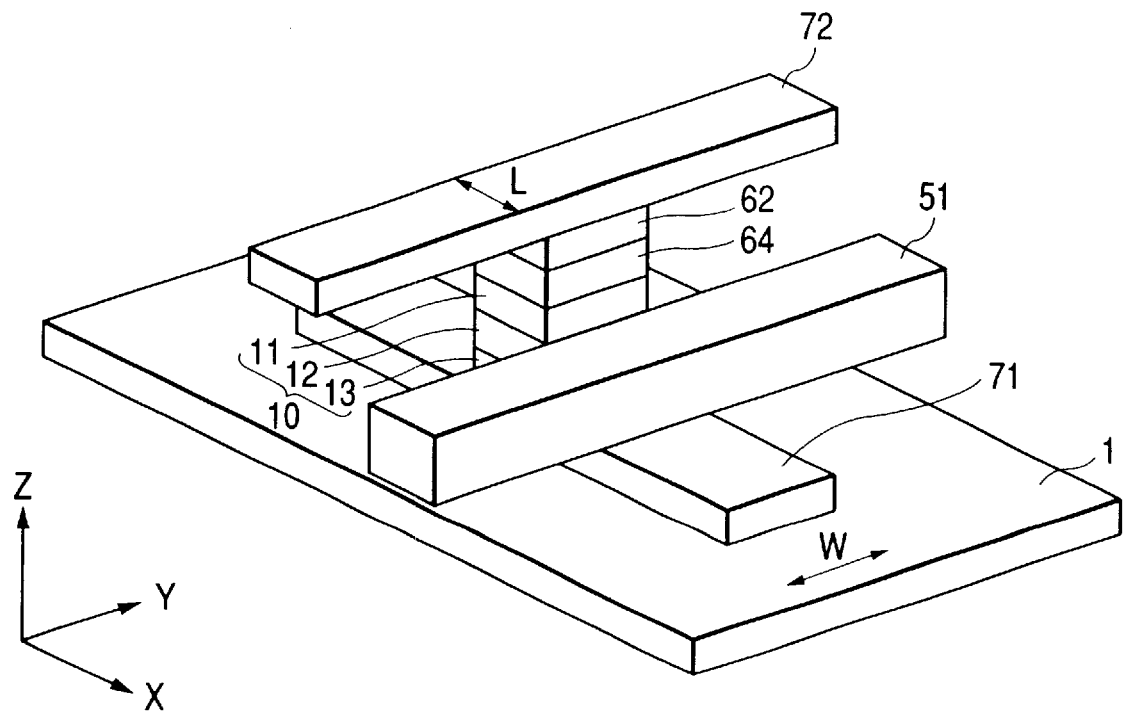
FIG. 14 is a perspective view diagrammatically showing the construction of an MRAM of Example 5, which is an example of the MRAM having a spin dependent tunneling structure using a perpendicular magnetization film of the present invention.

FIG. 14 shows a structural example of the MRAM of the present invention, used in the present Example. In FIG. 14, shown is an example of device construction in which a spin dependent tunneling type magnetoresistance film of the perpendicular magnetization film type is used and a magnetization-fixing layer having layer constitution different from that of this magnetoresistance film is provided. Reference numeral 1 denotes a substrate; 11, a first ferromagnetic layer; 12, a non-magnetic layer; and 13, a second ferromagnetic layer. The layers 11, 12 and 13 are combined to form a magnetoresistance film 10. On the second ferromagnetic layer 13 of this magnetoresistance film 10, a magnetization-fixing layer 62 and a non-magnetic layer 64 are superposed. Reference numerals 71 and 72 denote conductor wires. The conductor wire 71 is electrically connected to the second ferromagnetic layer 13, and the conductor wire 72 to the magnetization-fixing layer 62. A conductor wire 51 which functions as a word wire is further provided on the side of the magnetoresistance film 10 via an insulating film (not shown) in the same direction as the conductor wire 72. The conductor wires 71 and 72 act as a lower sense wire and an upper sense wire, respectively, and sense electric current is flowed through these sense wires from the lower sense wire to the upper sense wire passing through the magnetoresistance film 10. Information is recorded and reproduced by means of a synthesized magnetic field generated by electric currents flowed through the sense wire and word wire. For device processing, a conventional semiconductor fabrication process was used.

To form films of respective materials, a sputtering reactor was used. Films were formed at an ultimate pressure of $5 \times 10^{-5}$ Pa or below to form an Al film as the conductor wire 71, a $Gd_{21}Fe_{79}$ film as the first ferromagnetic layer 11, an AlOx film as the non-magnetic layer 12, a $Gd_{21}Fe_{79}$ film as the second ferromagnetic layer 13, an SiN film as the insulating film, an Al film as the conductor wire 72, a Cu film as the non-magnetic layer 64 and a $Tb_{26}Fe_{74}$ film as the magnetization-fixing layer 62. These films are formed in a thickness of 25 nm for the conductor wire 71 Al film, 15 nm for the first ferromagnetic layer 11 $Gd_{21}Fe_{79}$ film, 2.2 nm for the non-magnetic layer 12 AlOx film, 40 nm for the second ferromagnetic layer 13 $Gd_{21}Fe_{79}$ film, 50 nm for the conductor wire 72 Al film, 60 nm for the insulating film SiN film, 5 nm for the non-magnetic layer 64 Cu film and 50 nm for the magnetization-fixing layer 62 $Tb_{26}Fe_{74}$ film. Here, the first ferromagnetic layer 11 functions as a reproducing layer, and the second ferromagnetic layer as a memory layer. In the formation of the non-magnetic layer 12 AlOx film, Al was first deposited by sputtering and thereafter oxygen was introduced into the reactor, followed by leaving at 1,000 Pa for 125 minutes to form an AlOx oxide film. After the aluminum oxide film was formed, evacuation was made up to a predetermined ultimate pressure to remove the oxygen introduced, and then the next $Gd_{21}Fe_{79}$ film was formed. In the present Example, the magnetization-fixing layer is formed using a magnetic material different from that of the magnetic film that forms the magnetoresistance film, but a layer having the same layer constitution as the magnetic film that forms the magnetoresistance film may be used.

To a plurality of samples (memory devices) having different L and W, the sense electric current and the word electric current were applied in the same manner as in Example 1 to record and reproduce information, and inspection was made on whether or not signals were reproducible with only the electric current on the plus side.

Results obtained when the sense electric current was at 1 mA are shown in Table 5. It has been confirmed that, where the magnetization-fixing layer 62 is provided, signals can be reproduced with only the plus-side electric current. The results shown in Table 5 indicates that signal size attained at the sense electric current of 1 mA changes in inverse proportion to area, depending on the planar shape (area) of the magnetoresistance film.

In the present Example, the device is so constructed that the non-magnetic layer Cu film is held between the magnetization-fixing layer and the magnetoresistance film. This non-magnetic layer is provided in order to control the magnitude of magnetic coupling force acting between the magnetization-fixing layer and the ferromagnetic layer. Accordingly, it is possible to omit this non-magnetic layer under appropriate selection of materials and layer thickness of the magnetization-fixing layer.

TABLE 5

| L/W | W (μm) | L (μm) | ΔVs (mV) | Reproduction |
|---|---|---|---|---|
| 1 | 5 | 5 | 412 | Reproducible |
| 1 | 10 | 10 | 108 | Reproducible |
| 2 | 10 | 20 | 65 | Reproducible |
| 1 | 20 | 20 | 23 | Reproducible |
| 1 | 30 | 30 | 11 | Reproducible |

As having been described above, by disposing a magnetization-fixing layer in the vicinity of the reproducing layer of MRAM, the effect attributable to the present invention is that signals can be reproduced only with the plus-side or minus-side pulse electric current, without positive/ negative switching the direction of application of electric current for generating the electric current magnetic field at the time of reproduction of signals. Accordingly, signals may be detected by only supplying any one of positive and negative pulse electric currents. Hence, in reproduction-only machines, an advantage that no bipolar powder source is required is brought about and also devices can be made compact, as being different from conventional reproducing devices. As the result, cost reduction can be achieved, making it possible to provide inexpensive memory devices and non-volatile solid-state memories therefor.

What is claimed is:

1. A magnetoresistance effect type memory in and from which information is recorded and reproduced by utilizing a magnetoresistance effect, the memory comprising:

a substrate;

a magnetoresistance film provided on the substrate, which comprises a reproducing layer, a memory layer and a non-magnetic layer provided between the reproducing layer and the memory layer; and a magnetization-fixing layer provided on the substrate, which orients a magnetization of the reproducing layer to one direction.

2. The magnetoresistance effect type memory according to claim 1, wherein said magnetization-fixing layer orients the magnetization of said reproducing layer in one direction by a magnetic coupling force or a floating magnetic field.

3. The magnetoresistance effect type memory according to claim 2, wherein said magnetic coupling force is exchange coupling force.

4. The magnetoresistance effect type memory according to claim 2, wherein said magnetic coupling force is magnetostatic coupling force.

5. The magnetoresistance effect type memory according to claim 1, wherein said magnetization-fixing layer is provided on a side portion of said magnetoresistance film.

6. The magnetoresistance effect type memory according to claim 1, wherein said magnetization-fixing layer is provided at an upper part of said magnetoresistance film.

7. The magnetoresistance effect type memory according to claim 1, wherein a conductor wire is disposed on said magnetoresistance film on a side opposite to said substrate.

8. The magnetoresistance effect type memory according to claim 1, wherein said non-magnetic layer comprises a conductor.

9. The magnetoresistance effect type memory according to claim 1, wherein said non-magnetic layer comprises an insulator.

10. The magnetoresistance effect type memory according to claim 1, wherein said magnetization-fixing layer has the same layer constitution as said magnetoresistance film.

11. The magnetoresistance effect type memory according to claim 1, wherein said magnetization-fixing layer has a layer constitution different from that of said magnetoresistance film.

12. The magnetoresistance effect type memory according to claim 1, wherein the direction of magnetization of said magnetoresistance film is substantially in-plane direction with respect to film plane.

13. The magnetoresistance effect type memory according to claim 10, wherein length L of magnetoresistance film along with easy axis of magnetization of said magnetoresistance film and length P of said magnetization-fixing layer are selected in the range of P/L>2.5.

14. The magnetoresistance effect type memory according to claim 1, wherein the direction of magnetization of said magnetoresistance film is substantially perpendicular direction with respect to film plane.

15. The magnetoresistance effect type memory according to claim 14, wherein a non-magnetic layer having an electrical conductivity is provided between said magnetoresistance film and said magnetization-fixing layer.

16. A recording-reproducing method for the magnetoresistance effect type memory according to claim 7, the method comprising the steps of:

applying any one of positive and negative electric current pulses to said conductor wire; and detecting a change in resistance of said magnetoresistance film to reproduce information recorded in the memory layer.

17. A recording-reproducing device for recoding and reproducing information in and from the magnetoresistance effect type memory according to claim 7, the device comprising:

a means for supplying a uni-directional electric current to said conductor wire; and a means for detecting a change in resistance of said magnetoresistance film to reproduce information recorded in the memory.

18. A magnetoresistance effect type memory according to claim 1, wherein a coercive force of said memory layer is greater than that of said reproducing layer.

19. A magnetoresistance effect type memory according to claim 18, further comprising a conductor wire for generating a magnetic field which changes the direction of magnetization of said reproducing layer and/or said memory layer when supplied with a current.

20. A recording-reproducing method for the magnetoresistance effect type memory according to claim 19, the method comprising the steps of:

changing temporarily the direction of magnetization of said reproducing layer by a magnetic field generated by applying positive or negative electric current pulses to said conductor wire, and detecting a change of resistance of said magnetoresistance film as a result of the changing of the direction of magnetization of the reproducing layer to reproduce an information recorded in said memory layer.

21. An MRAM for reproducing information comprising a plurality of said magnetoresistance effect type memory according to claim 19 on said substrate, whereby information recorded in said memory layer is reproduced by detection of a change in resistance of said magnetoresistance film by changing temporarily the direction of magnetization of said reproducing layer by a magnetic field generated by supplying a one-way electric current pulse to said conductor wire.

* * * * *